(12) United States Patent
Song et al.

(10) Patent No.: US 9,406,770 B2
(45) Date of Patent: Aug. 2, 2016

(54) METHOD OF FABRICATING SEMICONDUCTOR DEVICE HAVING A RESISTOR STRUCTURE

(71) Applicant: Samsung Electronics Co., Ltd., Suwon-si (KR)

(72) Inventors: Hyun-Seung Song, Incheon (KR); Hwi-Chan Jun, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/668,430

(22) Filed: Mar. 25, 2015

(65) Prior Publication Data

US 2016/0020148 A1 Jan. 21, 2016

(30) Foreign Application Priority Data

Jul. 16, 2014 (KR) .................. 10-2014-0090006

(51) Int. Cl.
*H01L 21/8234* (2006.01)
*H01L 29/45* (2006.01)
*H01L 21/285* (2006.01)
*H01L 49/02* (2006.01)
*H01L 29/66* (2006.01)
*H01L 27/06* (2006.01)
*H01L 29/51* (2006.01)

(52) U.S. Cl.
CPC ........ *H01L 29/456* (2013.01); *H01L 21/28518* (2013.01); *H01L 21/28568* (2013.01); *H01L 27/0629* (2013.01); *H01L 28/24* (2013.01); *H01L 29/66545* (2013.01); *H01L 29/513* (2013.01); *H01L 29/517* (2013.01); *H01L 29/665* (2013.01)

(58) Field of Classification Search
CPC . H01L 21/8234; H01L 28/20; H01L 27/0629; H01L 29/66545
USPC ......................................................... 438/238
See application file for complete search history.

(56) References Cited

U.S. PATENT DOCUMENTS

| | | | |
|---|---|---|---|
| 6,756,262 | B1 | 6/2004 | Nakamura et al. |
| 7,071,485 | B2 | 7/2006 | Takaura et al. |
| 7,470,923 | B2 | 12/2008 | Takaura et al. |
| 7,633,165 | B2 | 12/2009 | Hsu et al. |
| 8,129,707 | B2 | 3/2012 | Takaura et al. |
| 8,455,875 | B2 | 6/2013 | Booth, Jr. et al. |
| 2004/0238962 | A1 | 12/2004 | Jung et al. |
| 2006/0022276 | A1* | 2/2006 | Park ............... H01L 27/0629 257/368 |
| 2007/0096183 | A1* | 5/2007 | Ogawa ............ H01L 27/0629 257/300 |

(Continued)

FOREIGN PATENT DOCUMENTS

| | | |
|---|---|---|
| JP | 2001-144266 | 5/2001 |
| JP | 4634014 | 2/2011 |

(Continued)

*Primary Examiner* — Phuc Dang
(74) *Attorney, Agent, or Firm* — Myers Bigel & Sibley, P.A.

(57) ABSTRACT

Provided is a method of fabricating a semiconductor device. The method includes providing a substrate including a transistor area and a resistor area, forming dummy gate structures on the substrate in the resistor area, and a lower interlayer insulating layer; forming a resistor structure having a buffer insulating pattern, a resistor element and an etch-retard pattern disposed sequentially on the lower interlayer insulating layer; and forming resistor contact structures configured to pass through the etch-retard pattern and to contact with the resistor element.

19 Claims, 25 Drawing Sheets

(56) References Cited

U.S. PATENT DOCUMENTS

| | | |
|---|---|---|
| 2008/0048166 A1 | 2/2008 | Takaura et al. |
| 2012/0252206 A1 | 10/2012 | Naik et al. |
| 2013/0049924 A1* | 2/2013 | Yang .............. H01L 28/20 338/314 |
| 2013/0161722 A1 | 6/2013 | Son et al. |
| 2013/0241001 A1* | 9/2013 | Chen .............. H01L 27/0629 257/380 |
| 2013/0334587 A1 | 12/2013 | Purayath et al. |
| 2014/0167181 A1* | 6/2014 | Xiong ............ H01L 27/0629 257/379 |

FOREIGN PATENT DOCUMENTS

| | | |
|---|---|---|
| KR | 1020060030200 A | 4/2006 |
| KR | 1020120037653 A | 4/2012 |
| KR | 1020130074296 A | 7/2013 |

* cited by examiner

METHOD OF FABRICATING SEMICONDUCTOR DEVICE HAVING A RESISTOR STRUCTURE

CROSS-REFERENCE TO RELATED APPLICATION

This application claims priority under 35 U.S.C. §119 to Korean Patent Application No. 10-2014-0090006 filed on Jul. 16, 2014, the disclosure of which is hereby incorporated by reference in its entirety.

BACKGROUND

1. Field

Embodiments of the inventive concept relate to a semiconductor device having a resistor structure and a fabricating method thereof.

2. Description of Related Art

In general, a semiconductor device may include a transistor or a diode as an active device, and a resistor element or a capacitor as a passive device. Among them, the resistor element may be used as a device for operating an integrated circuit or the like, and may be formed of a metallic material. Generally, in a semiconductor device having a multilayered interconnection structure, multilayered interconnections may be electrically connected through interlayer vias formed of copper (Cu). When the interlayer via is in direct contact with the resistor element, a copper component in the interlayer via is diffused into the resistor element, and a void is generated in the interlayer via, and, thus, it may cause a problem in reliability of the interlayer via.

SUMMARY

Embodiments of the inventive concepts provide a semiconductor device having a resistor structure, which is capable of maintaining reliability of interlayer vias, and preventing from loss of the resistor structure at the time of forming a contact hole.

Embodiments of the inventive concepts provide a method of fabricating the semiconductor device.

In accordance with embodiments of the inventive concepts, a method of fabricating a semiconductor device may include providing a substrate including a transistor area and a resistor area, forming active gate structures on the substrate in the transistor area, forming dummy gate structures on the substrate in the resistor area, forming a lower interlayer insulating layer to cover side walls of the active gate structures and the dummy gate structures, forming a resistor structure comprising a buffer insulating pattern, a resistor element, and an etch-retard pattern stacked sequentially on the dummy gate structures and the lower interlayer insulating layer of the resistor area, forming an intermediate interlayer insulating layer on the lower interlayer insulating layer to cover the resistor structure, forming resistor contact structures configured to pass through the intermediate interlayer insulating layer and the etch-retard pattern and to contact the resistor element, and forming an upper interlayer insulating layer on the intermediate interlayer insulating layer and the resistor contact structures.

In accordance with embodiments of the inventive concepts, a method of fabricating a semiconductor device may include providing a substrate including a transistor area and a resistor area, forming active gate structures on the substrate in the transistor area, and dummy gate structures on the substrate in the resistor area, forming source/drain areas in the substrate between the active gate structures, forming a lower interlayer insulating layer on the substrate between the active gate structures and between the dummy gate structures to cover the source/drain areas, sequentially forming a buffer insulating layer, a resistor conductive layer, and an etch-retard layer on the active gate structures, the dummy gate structures, and the lower interlayer insulating layer, patterning the buffer insulating layer, the resistor conductive layer, and the etch-retard layer, and forming a resistor structure including a buffer insulating pattern, a resistor element and an etch-retard pattern in the resistor area, wherein a side surface of the buffer insulating pattern, a side surface of the resistor element, and a side surface of the etch-retard pattern are substantially vertically aligned, forming an intermediate interlayer insulating layer configured to cover the active gate structures, the dummy gate structures, the lower interlayer insulating layer, and the resistor structures, forming first contact holes configured to expose the source/drain areas in the intermediate interlayer insulating layer and the lower interlayer insulating layer, second contact holes configured to expose the resistor element in the intermediate interlayer insulating layer and the etch-retard pattern, and third contact holes configured to expose the active gate structures in the intermediate interlayer insulating layer, forming source/drain contact structures in the first contact holes, resistor contact structures in the second contact holes, and gate contact structures in the third contact holes, and forming an upper interlayer insulating layer configured to cover the source/drain contact structures, the resistor contact structures and the gate contact structures on the intermediate interlayer insulating layer.

In accordance with embodiments of the inventive concepts, a method may include providing a substrate comprising a transistor area and a resistor area, forming gate structures on the resistor area of the substrate; forming a resistor gate structures, forming an etch-retard pattern on the resistor element, the etch-retard pattern having openings formed therein to expose the resistor element, and forming resistor contact structures comprising a silicide pattern on the resistor element in the openings formed in the etch-retard pattern, wherein a side surface of the resistor element and a side surface of the etch-retard pattern are substantially vertically aligned.

Other methods, systems, and/or devices according to embodiments of the inventive concepts will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
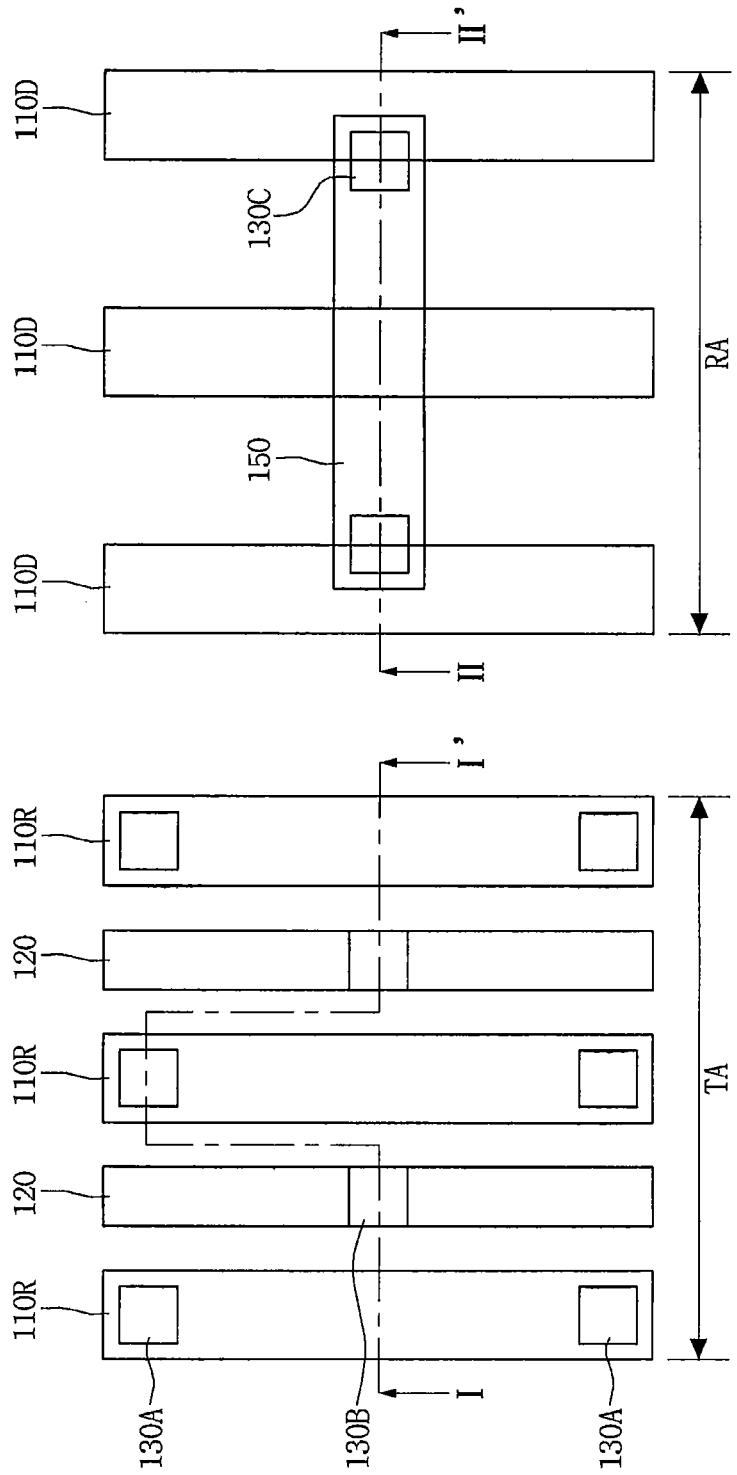
FIG. 1 is a schematic layout of a semiconductor device in accordance with embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. The present inventive concepts are defined only by the scope of the claims.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional and/or plane illustrations that are schematic illustrations of idealized embodiments. In the drawings, the thickness of the layers or the areas may be exaggerated illustrated for effective explanation of the technical contents. As such, variations from the shapes of the illustrations as a result, for example, of manufacturing techniques and/or tolerances, are to be expected. Thus, embodiments should not be construed as limited to the particular shapes of areas illustrated herein but are to include deviations in shapes that result, for example, from manufacturing. Thus, the areas illustrated in the figures are schematic in nature and their shapes are not intended to illustrate the actual shape of an area of a device and are not intended to limit the scope of the present inventive concepts.

The same components are designated by the same reference numerals throughout the specification, even though they are depicted in different drawings. Therefore, even if the same or like reference numerals are not referred or described in a related drawing, they may be described with reference to another drawing. Further, even if an element is not assigned a reference numeral in a drawing, this element may be described with reference to other drawings.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a schematic layout of a semiconductor device in accordance with embodiments of the inventive concepts, and FIGS. 2A to 2D are cross-sectional views taken along lines I-I' and II-II' of FIG. 1.

Figure 2A:
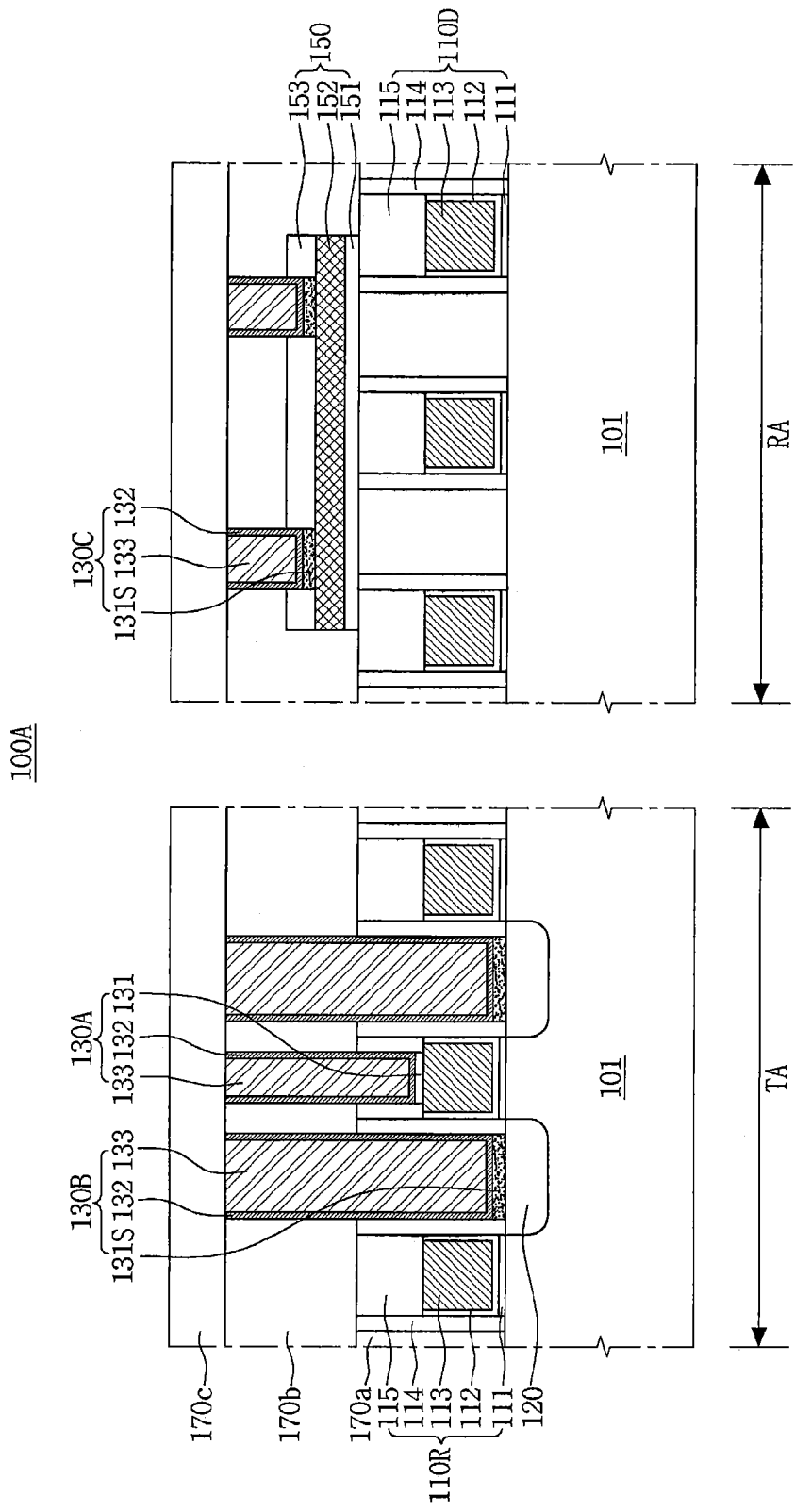
FIGS. 2A to 2D are cross-sectional views of the semiconductor device in accordance with embodiments of the inventive concepts, which are taken along lines I-I' and II-II' of FIG. 1.

Referring to FIGS. 1 and 2A, a semiconductor device 100A in accordance with an embodiment of the inventive concepts may include a transistor area TA and a resistor area RA.

The transistor area TA may include a substrate 101, active gate structures 110R, source/drain areas 120, gate contact structures 130A, and source/drain contact structures 130B. The transistor area TA may further include a lower interlayer insulating layer 170a configured to cover side walls of the active gate structures 110R, an intermediate interlayer insulating layer 170b formed on the active gate structures 110R, and an upper interlayer insulating layer 170c formed on the intermediate interlayer insulating layer 170b, the gate contact structures 130A, and the source/drain contact structures 130B.

The substrate 101 may include a bulk single crystalline silicon substrate or a silicon-on-insulator (SOI) substrate. The substrate 101 may include fins protruding upwardly from the substrate 101.

Each of the active gate structures 110R may include a gate buffer insulating pattern 111, a gate insulating pattern 112, a gate electrode 113, a gate spacer pattern 114, and a gate capping pattern 115. The active gate structures 110R form transistors together with the source/drain areas 120, and may be used to operate the transistors.

The gate buffer insulating pattern 111 is formed on the substrate 101, and may be in contact with the substrate 101. The gate buffer insulating pattern 111 may include oxidized silicon formed by oxidizing a surface of the substrate 101.

The gate insulating pattern 112 is formed on the gate buffer insulating pattern 111, and may be in contact with the gate buffer insulating pattern 111. The gate insulating pattern 112 may have a cross-sectional U-shape to cover a lower surface and side surfaces of the gate electrode 113. The gate insulating pattern 112 may include a metallic oxide, such as hafnium oxide (HfO).

The gate electrode 113 may include a metallic material, such as tungsten (W) or aluminum (Al). An upper surface of the gate insulating pattern 112 and an upper surface of the gate electrode 113 may be coplanar.

The gate spacer pattern 114 may be formed on outside surfaces of the gate insulating pattern 112. The gate spacer pattern 114 may include silicon nitride. An upper surface of the gate spacer pattern 114 may be disposed at a higher level than the upper surface of the gate insulating pattern 112 and the upper surface of the gate electrode 113 relative to the substrate 101.

The gate capping pattern 115 may be formed on the gate insulating pattern 112 and the gate electrode 113. For example, a lower surface of the gate capping pattern 115 may be in contact with the upper surface of the gate insulating pattern 112 and the upper surface of the gate electrode 113. Further, a side surface of the gate capping pattern 115 may be in contact with inside surfaces of the gate spacer pattern 114. The gate capping pattern 115 may include silicon nitride. An upper surface of the gate capping pattern 115 may be coplanar with the upper surface of the gate spacer pattern 114.

The source/drain areas 120 may include N-type or P-type impurities doped in the substrate 101. The N-type impurities may include phosphorus (P) or arsenic (As). The P-type impurities may include boron (B). The source/drain areas 120 may include a semiconductor epitaxial layer. For example, the epitaxial layer may include SiGe, Si, or SiC. The source/drain areas 120 may include a metal-silicide. For example, tungsten silicide (WSi), titanium silicide (TiSi), cobalt silicide (CoSi), or nickel silicide (NiSi) may be included.

The gate contact structures 130A may include a glue pattern 131, a barrier pattern 132, and a core pattern 133.

The glue pattern 131 may be in direct contact with the gate electrode 113. The glue pattern 131 may include titanium.

The barrier pattern 132 may be formed on the glue pattern 131. The barrier pattern 132 may have a cross-sectional U-shape to cover a lower surface and side surfaces of the core pattern 133. The barrier pattern 132 may include titanium nitride (TiN).

The core pattern 133 may include tungsten (W). An upper surface of the barrier pattern 132 and an upper surface of the core pattern 133 may be coplanar.

The source/drain contact structures 130B may include a silicide pattern 131S, the barrier pattern 132, and the core pattern 133.

The silicide pattern 131S may be formed on the source/drain areas 120. The silicide pattern 131S may be in direct contact with the source/drain areas 120. The silicide pattern 131S may include titanium silicide (TiSi).

The barrier pattern 132 may be formed on the silicide pattern 131S. The barrier pattern 132 may have a cross-sectional U-shape to cover the lower surface and the side surface of the core pattern 133. The barrier pattern 132 may include titanium nitride (TiN).

The core pattern 133 may include the tungsten (W). The upper surface of the barrier pattern 132 and the upper surface of the core pattern 133 may be coplanar.

The lower interlayer insulating layer 170a may cover side surfaces of the active gate structures 110R. For example, the lower interlayer insulating layer 170a may be in direct contact with outside surfaces of the gate spacer pattern 114. The lower interlayer insulating layer 170a may include silicon oxide such as fluorosilicate glass (FSG) or tetraethyl orthosilicate (TEOS).

The intermediate interlayer insulating layer 170b may be formed on the lower interlayer insulating layer 170a and the active gate structures 110R to cover the lower interlayer insulating layer 170a and the active gate structures 110R. The intermediate interlayer insulating layer 170b may cover side surfaces of the gate contact structures 130A and side surfaces of the source/drain contact structures 130B. The intermediate interlayer insulating layer 170b may include silicon oxide.

The upper interlayer insulating layer 170c may be formed on the intermediate interlayer insulating layer 170b, the gate contact structures 130A, and the source/drain contact structures 130B to cover the intermediate interlayer insulating layer 170b, the gate contact structures 130A, and the source/drain contact structures 130B. The upper interlayer insulating layer 170c may include silicon oxide.

The resistor area RA may include the substrate 101, dummy gate structures 110D, a resistor structure 150, and resistor contact structures 130C. The resistor area RA may further include the lower interlayer insulating layer 170a configured to cover side surfaces of the dummy gate structures 110D, the intermediate interlayer insulating layer 170b stacked on the dummy gate structures 110D, and the upper interlayer insulating layer 170c stacked on the resistor contact structures 130C.

Each of the dummy gate structures 110D may include the gate buffer insulating pattern 111, the gate insulating pattern 112, the gate electrode 113, the gate spacer pattern 114, and the gate capping pattern 115. The dummy gate structures 110D do not form the transistors and are not used to operate the transistors. The source/drain area is not formed in the substrate 101 between the dummy gate structures 110D.

The gate buffer insulating pattern 111 may be in contact with an upper surface of the substrate 101. The gate buffer insulating pattern 111 may include oxidized silicon formed by oxidizing a surface of the substrate 101.

The gate insulating pattern 112 may be formed on the gate buffer insulating pattern 111. The gate insulating pattern 112 may have a cross-sectional U-shape to cover the lower surface and the side surface of the gate electrode 113. The gate insulating pattern 112 may include a metallic oxide, such as hafnium oxide (HfO).

The gate electrode 113 may include the tungsten (W) or the aluminum (Al). The upper surface of the gate insulating pattern 112 and the upper surface of the gate electrode 113 may be coplanar.

The gate spacer pattern 114 may be formed on the side surface of the gate insulating pattern 112. The gate spacer pattern 114 may include silicon nitride. The upper surface of the gate spacer pattern 114 may be disposed at a higher level than the upper surface of the gate insulating pattern 112 and the upper surface of the gate electrode 113.

The gate capping pattern 115 may be formed on the gate insulating pattern 112 and the gate electrode 113. For example, the lower surface of the gate capping pattern 115 may be in direct contact with the upper surface of the gate insulating pattern 112 and the upper surface of the gate electrode 113. Further, the side surface of the gate capping pattern 115 may be in direct contact with the inside surface of the gate spacer pattern 114. The gate capping pattern 115 may include silicon nitride. The upper surface of the gate capping pattern 115 may be coplanar with the upper surface of the gate spacer pattern 114.

The resistor structure 150 may include a buffer insulating pattern 151, a resistor element 152, and an etch-retard pattern 153.

The buffer insulating pattern 151 may be formed on the dummy gate structures 110D and the lower interlayer insulating layer 170a. For example, a lower surface of the buffer insulating pattern 151 may be in direct contact with upper surfaces of the dummy gate structures 110D and the upper surface of the lower interlayer insulating layer 170a. The buffer insulating pattern 151 may be formed to partly cover the dummy gate structures 110D. For example, the buffer insulating pattern 151 may include silicon oxide, such as a high-density plasma oxide (HDP-oxide), which is denser than the lower interlayer insulating layer 170a. According to some embodiments, the dummy gate structures 110D may not be formed, and the lower interlayer insulating layer 170a may cover the substrate 101 of the resistor area RA.

The resistor element 152 may be formed on the buffer insulating pattern 151. The resistor element 152 may include the tungsten silicide (WSi). The etch-retard pattern 153 may be formed on the resistor element 152. A side surface of the etch-retard pattern 153, a side surface of the buffer insulating pattern 151, and a side surface of the resistor element 152 may be vertically aligned. The etch-retard pattern 153 may include silicon nitride. The etch-retard pattern 153 may cover lower side surfaces of the resistor contact structures 130C.

Each of the resistor contact structures 130C may include the silicide pattern 131S, the barrier pattern 132, and the core pattern 133. According to some embodiments, the silicide pattern 131S may not be formed.

The silicide pattern 131S may be in direct contact with the resistor element 152. The silicide pattern 131S may include titanium silicide (TiSi).

The barrier pattern 132 may be formed on the silicide pattern 131S. The barrier pattern 132 may have a cross-sectional U-shape to cover the lower surface and the side surfaces of the core pattern 133. Lower side surfaces of the barrier pattern 132 may be in direct contact with the etch-retard pattern 153. The barrier pattern 132 may include titanium nitride (TiN).

The core pattern 133 may include the tungsten (W). The upper surface of the barrier pattern 132 and the upper surface of the core pattern 133 may be coplanar.

The lower interlayer insulating layer 170a may cover the side surfaces of the dummy gate structures 110D. For example, the lower interlayer insulating layer 170a may be in direct contact with the outer side surfaces of the gate spacer pattern 114 of the dummy gate structures 110D. The lower interlayer insulating layer 170a may include silicon oxide.

The intermediate interlayer insulating layer 170b may be formed on the lower interlayer insulating layer 170a and the dummy gate structures 110D to cover the lower interlayer insulating layer 170a, the dummy gate structures 110D, and the resistor structure 150. The intermediate interlayer insulating layer 170b may cover the resistor structure 150 and the side surfaces of the resistor contact structures 130C. For example, the intermediate interlayer insulating layer 170b may be in direct contact with the outside surfaces of the barrier pattern 132 of the resistor contact structures 130C and an upper surface and side surfaces of the resistor structure 150. The intermediate interlayer insulating layer 170b may include silicon oxide.

The upper interlayer insulating layer 170c may be formed on the intermediate interlayer insulating layer 170b and the resistor contact structures 130C to cover the intermediate interlayer insulating layer 170b and the resistor contact structures 130C. The upper interlay insulating layer 170c may include silicon oxide.

The semiconductor device 100A according to an embodiment of the inventive concepts has been described. In the semiconductor device 100A according to the embodiment of the inventive concepts, because the etch-retard pattern 153 is additionally formed on the resistor element 152, a contact hole configured to expose the resistor element 152 is prevented from passing through the resistor element 152 when the contact hole is formed, and a lower end of the contact structure 130C formed in the contact hole may be silicidized, and thus contact failure between the contact structure 130C and the resistor element 152 may be reduced or prevented. That is, delamination of the contact structure 130C from the resistor element 152 may be reduced or prevented.

Further, in the semiconductor device 100A according to the embodiment of the inventive concepts, because the dummy gate structures 110D are formed on the resistor area RA of the substrate 101, the interlayer insulating layer 170a, 170b, 170c may not be excessively polished in a planarization process after forming the interlayer insulating layer 170a, 170b, 170c.

Further, in the semiconductor device 100A according to the embodiment of the inventive concepts, the buffer insulating pattern 151 is formed under the resistor element 152, and thus, even though the contact hole passes through the resistor element 152 at the time of forming the contact hole configured to expose the resistor element 152, the capping pattern 115 of each of the dummy gate structures 110D, which are located thereunder, may not be affected.

Figure 2B:
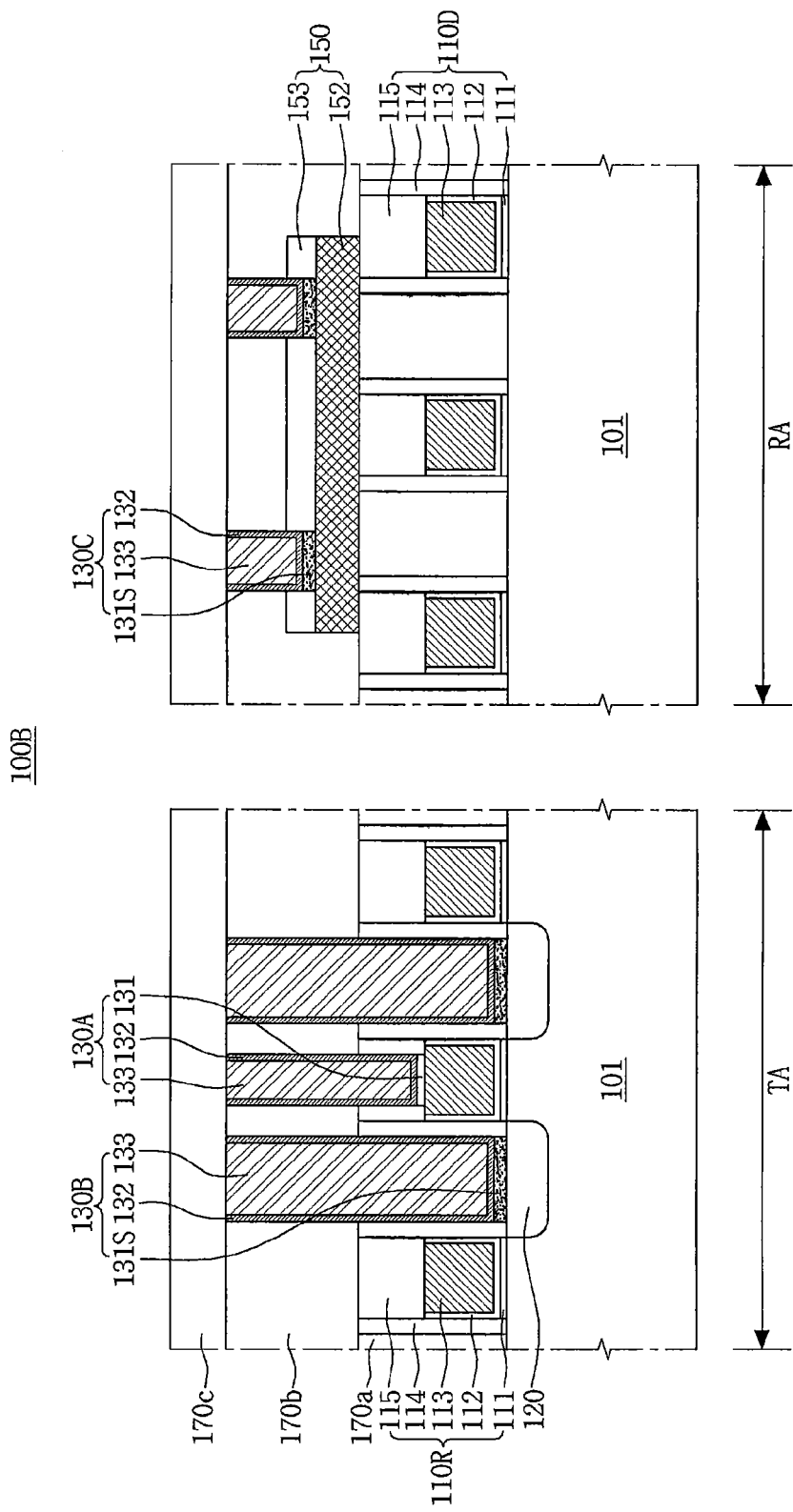

Referring to FIGS. 1 and 2B, in a semiconductor device 10013 according to an embodiments of the inventive concepts, the buffer insulating pattern 151 may be omitted in the resistor structure 150, when compared with FIG. 2A. Therefore, the resistor element 152 of the resistor structure 150 may be in direct contact with the upper surface of the lower interlayer insulating layer 170a and the upper surfaces of the dummy gate structures 110D.

Figure 2C:
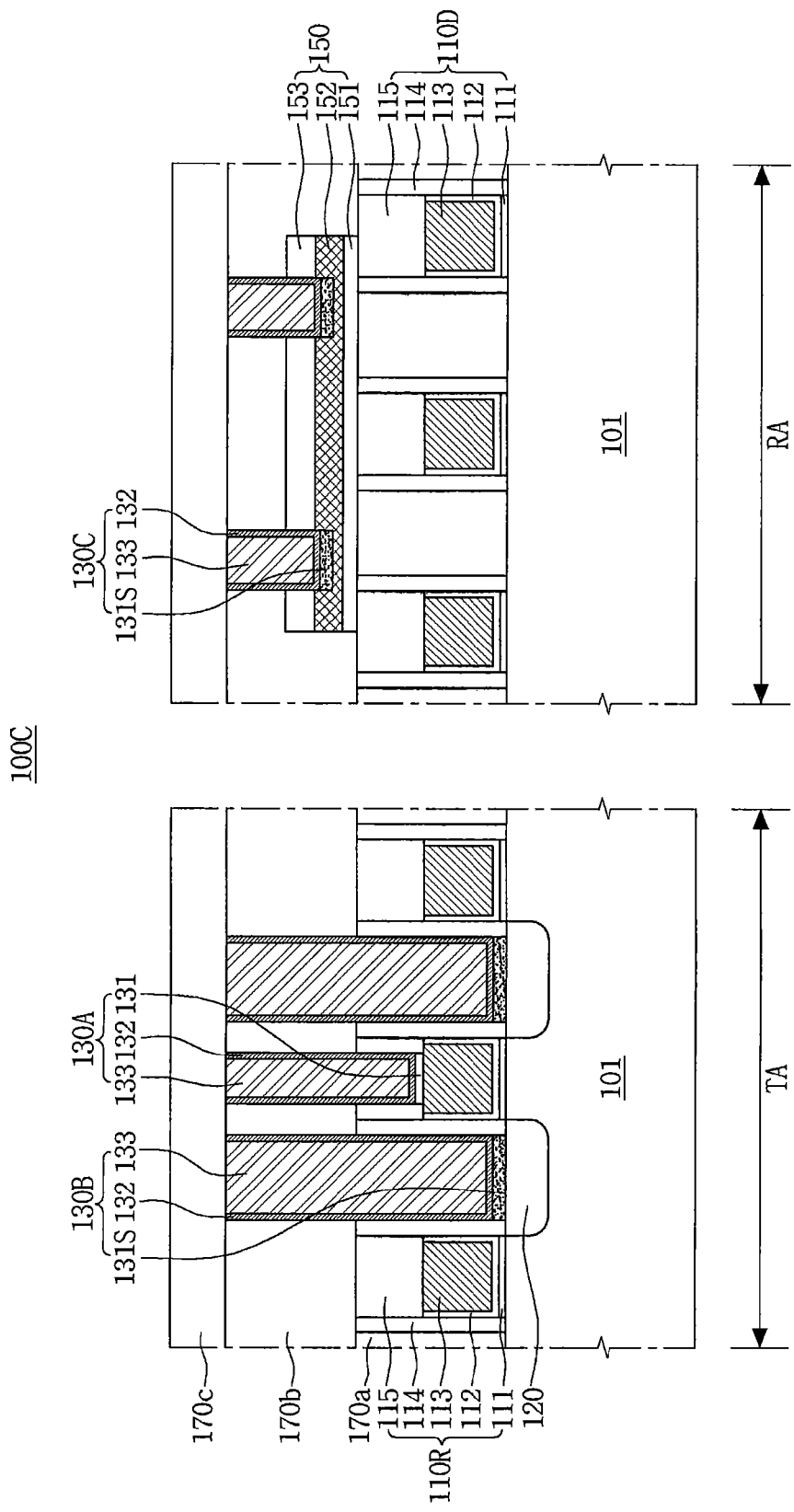

Referring to FIGS. 1 and 2C, in a semiconductor device 100C according to an embodiments of the inventive concepts, a lower end of the resistor contact structure 130C, which is in contact with the resistor element 152, may extend into the resistor element 152, when compared with FIG. 2A.

Figure 2D:
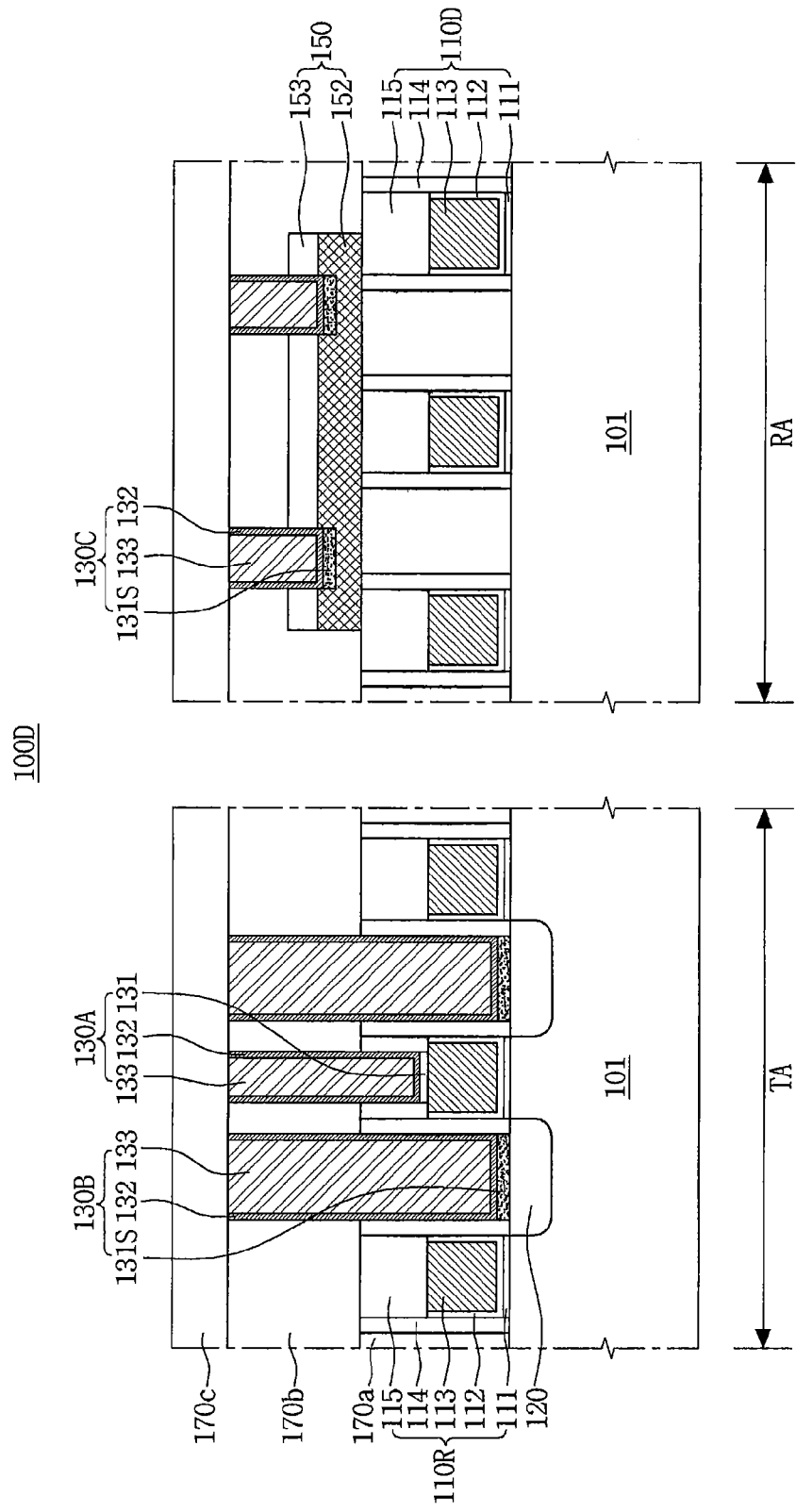

Referring to FIGS. 1 and 2D, in a semiconductor device 100D according to an embodiment of the inventive concepts, the buffer insulating pattern 151 may be omitted in the resistor structure 150, and the lower end of the resistor contact structure 130C, which is in contact with the resistor element 152, may extend into the resistor element 152, when compared with FIG. 2A.

FIGS. 3 to 21 are schematic cross-sectional views illustrating intermediate structures in a process in a method of fabricating the semiconductor device in accordance with embodiments of the inventive concepts, which are taken along lines I-I' and II-II' of FIG. 1.

Figure 3:
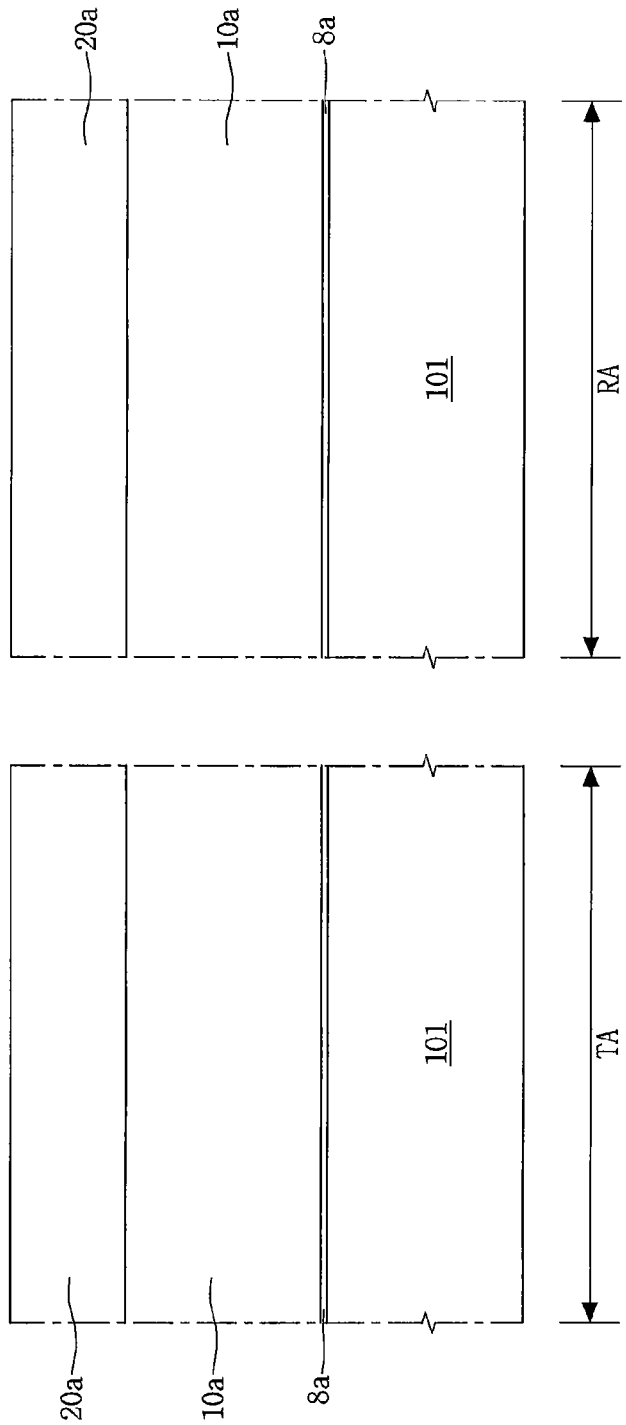
FIGS. 3 to 21 are cross-sectional views illustrating intermediate structures in a process in a method of fabricating the semiconductor device in accordance with embodiments of the inventive concepts, which are taken along lines I-I' and II-II' of FIG. 1.

Referring to FIG. 3, the method of fabricating the semiconductor device in accordance with embodiments of the inventive concepts may include forming a sacrificial buffer insulating layer 8a, a sacrificial layer 10a, and a hard mask layer 20a on the substrate 101. At this time, the sacrificial buffer insulating layer 8a, the sacrificial layer 10a, and the hard mask layer 20a may be formed on the substrate 101 in both of the transistor area TA and the resistor area RA.

The substrate 101 may include a bulk silicon substrate or an SOI substrate. The substrate 101 may include the transistor area TA and the resistor area RA. The substrate 101 may include fins protruding upwardly from the substrate 101. The forming of the sacrificial buffer insulating layer 8a may include oxidizing the surface of the substrate 101. The forming of the sacrificial layer 10a may include forming a poly-silicon layer by performing a deposition process. The forming of the hard mask layer 20a may include forming a silicon nitride layer by performing a deposition process.

Figure 4:
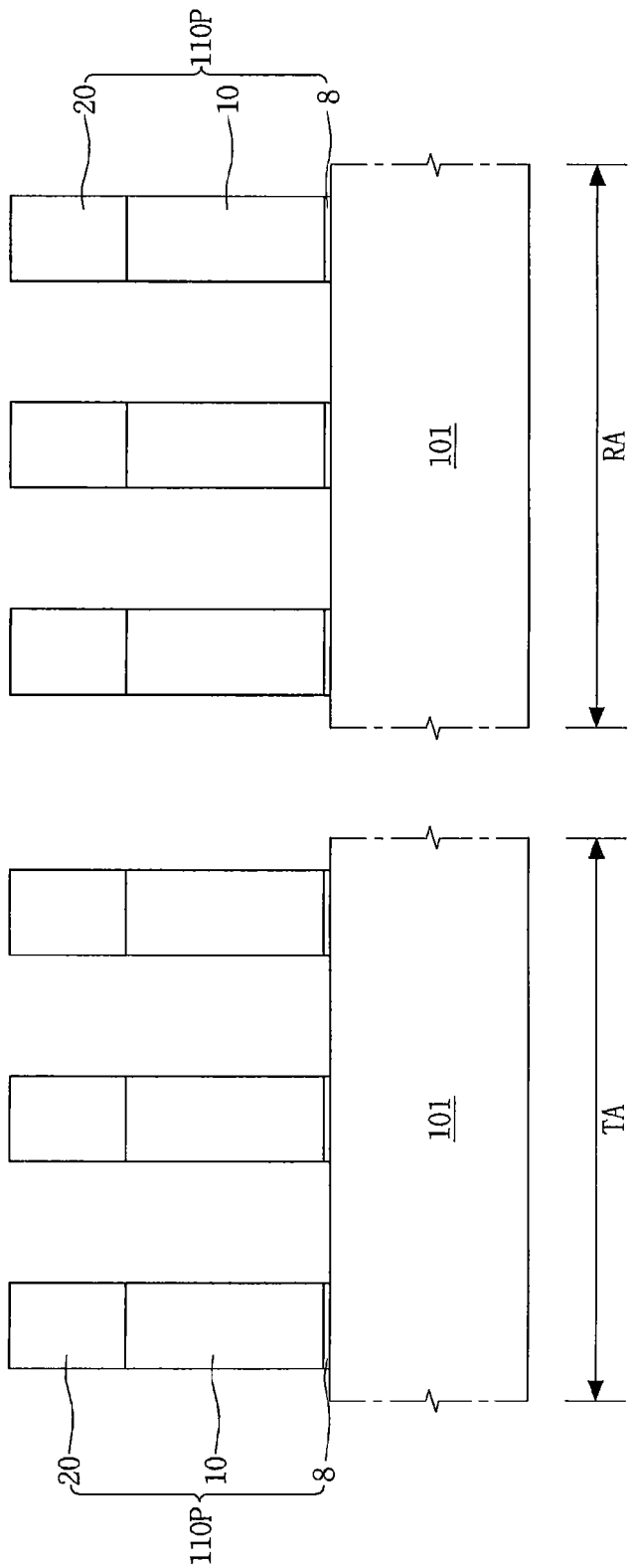

Referring to FIG. 4, the method of fabricating the semiconductor device in accordance with embodiments of the inventive concepts may include selectively etching the sacrificial buffer insulating layer 8a, the sacrificial layer 10a, and the hard mask layer 20a and forming preliminary gate structures 110P. Each of the preliminary gate structures 110P may include a sacrificial buffer insulating pattern 8, a sacrificial pattern 10, and a hard mask pattern 20, which are patterned. At this time, the preliminary gate structures 110P may be formed on both of the transistor area TA and the resistor area RA.

Figure 5:
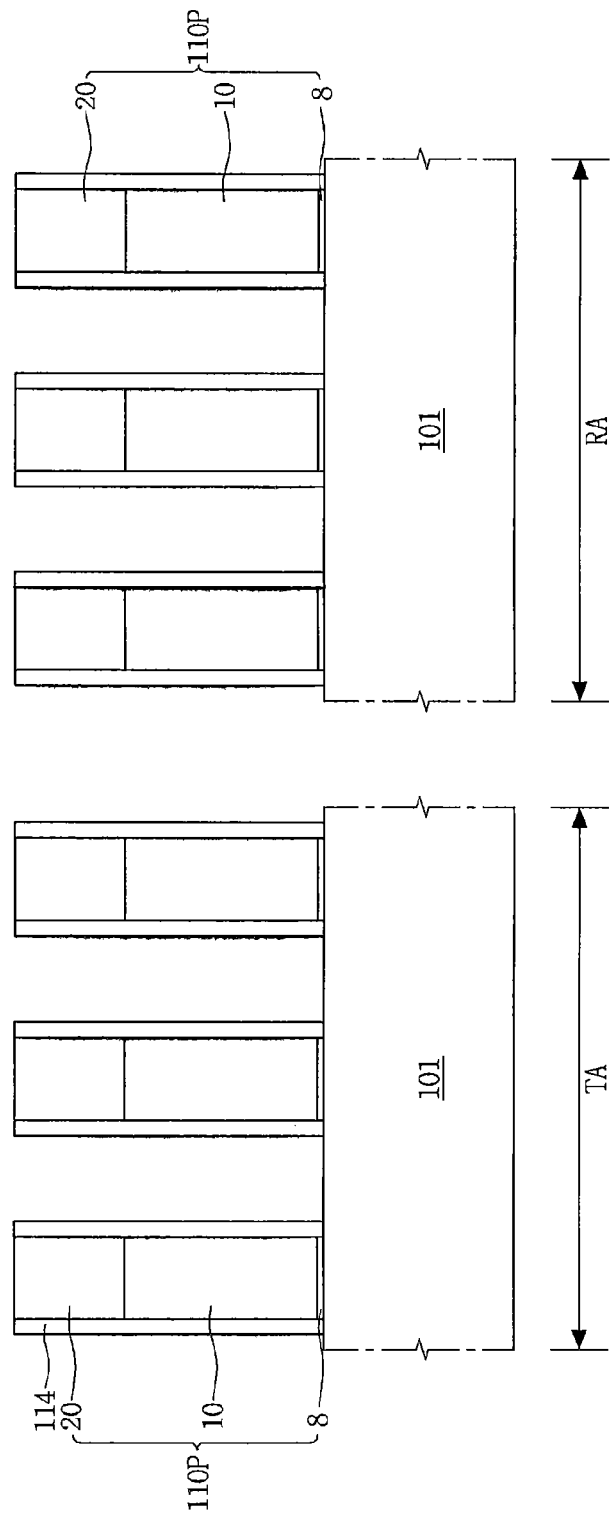
Figure 6:
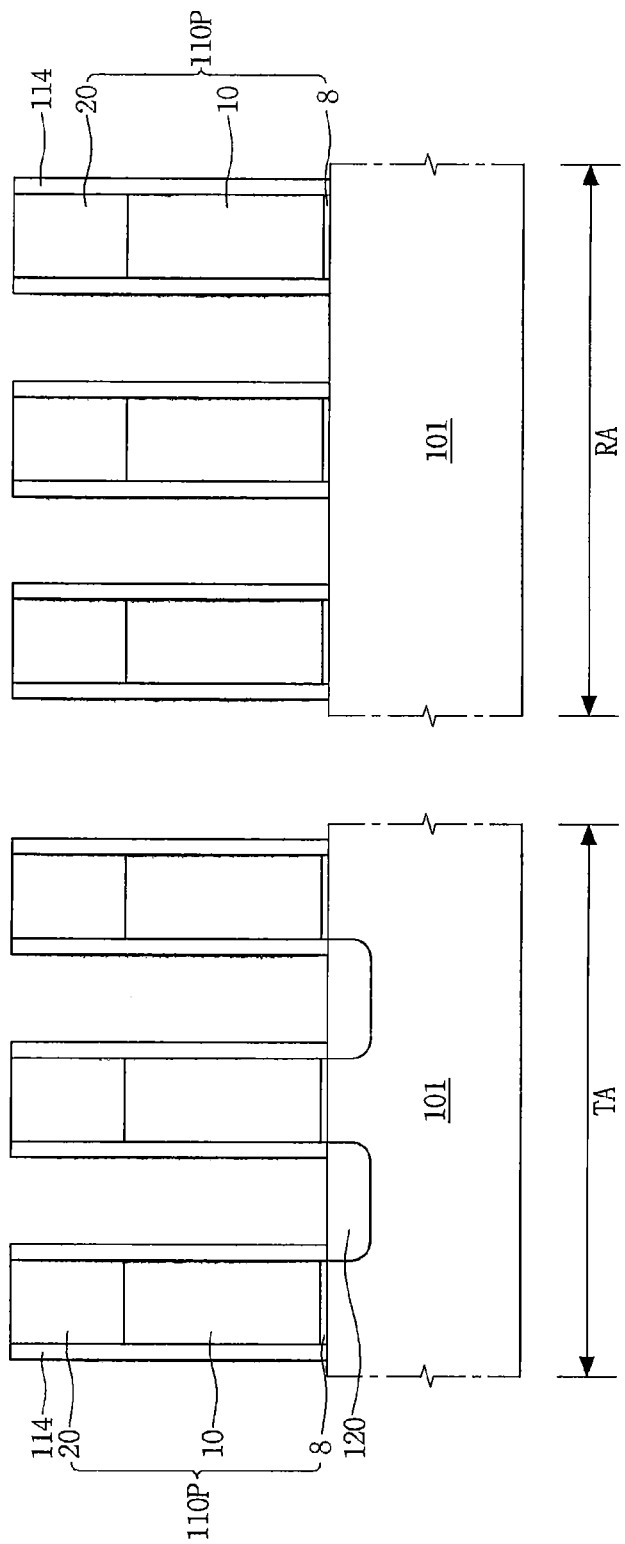

Referring to FIGS. 5 and 6, the method of fabricating the semiconductor device in accordance with embodiments of the inventive concepts may include forming the gate spacer pattern 114 on side surfaces of the preliminary gate structures 110P and forming the source/drain areas 120 in the substrate 101 between the gate spacer patterns 114 in the transistor area TA.

The forming of the gate spacer pattern 114 on the side surfaces of the preliminary gate structures 110P may include depositing an insulating layer, such as a silicon nitride layer on the substrate 101, and forming the gate spacer pattern 114 on the side surfaces of the preliminary gate structures 110P by performing an anisotropic dry-etching process. The insulating layer formed on upper surfaces of the preliminary gate structures 110P and the upper surface of the substrate 101 may be selectively removed.

The forming of the source/drain areas 120 may include implanting impurity ions into the substrate 101 exposed between the gate spacer patterns 114, and forming impurity layers. The impurity ions may include boron (B), phosphorus (P), or arsenic (As). The source/drain areas 120 may be formed in the transistor area TA. The source/drain areas 120 are not formed in the resistor area RA. According to some embodiments, the forming of the source/drain areas 120 may include removing a part of the substrate 101 between the gate spacer patterns 114, forming a recess area, and forming an epitaxial layer including impurities in the recess area. The epitaxial layer may include SiGe, Si, or SiC.

Figure 7:
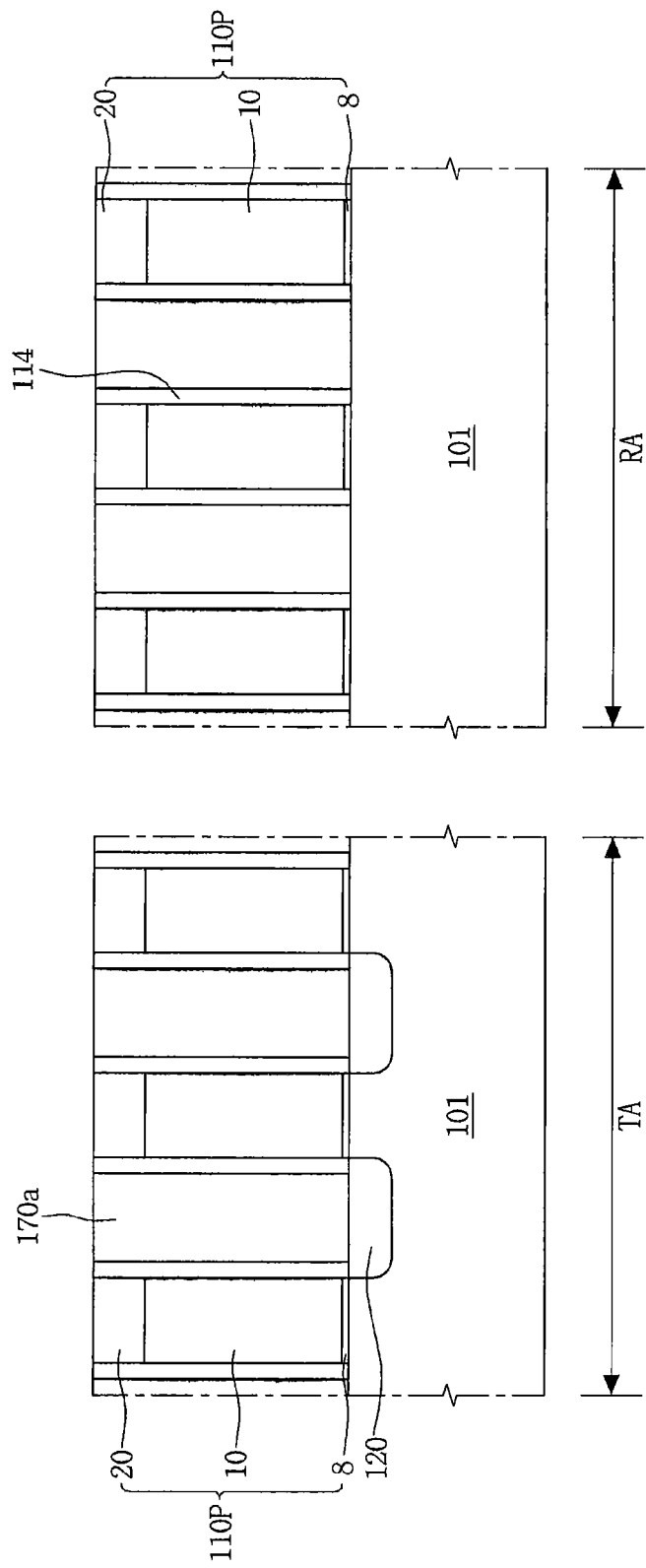

Referring to FIG. 7, the method of fabricating the semiconductor device in accordance with embodiments of the inventive concepts may include forming the lower interlayer insulating layer 170a configured to cover the preliminary gate structures 110P. For example, the lower interlayer insulating layer 170a may cover an outside surface of the gate spacer pattern 114 formed on the side surfaces of the preliminary gate structures 110P. The forming of the lower interlayer insulating layer 170a may include forming an insulating material layer to cover the preliminary gate structures 110P, the gate spacer pattern 114, and an exposed portion of the substrate 101 by performing a deposition process, and exposing the hard mask pattern 20 by performing a planarization process, such as a CMP process. At this time, an upper surface of the gate spacer pattern 114 formed on the side surfaces of the preliminary gate structures 110P may be exposed.

Figure 8:
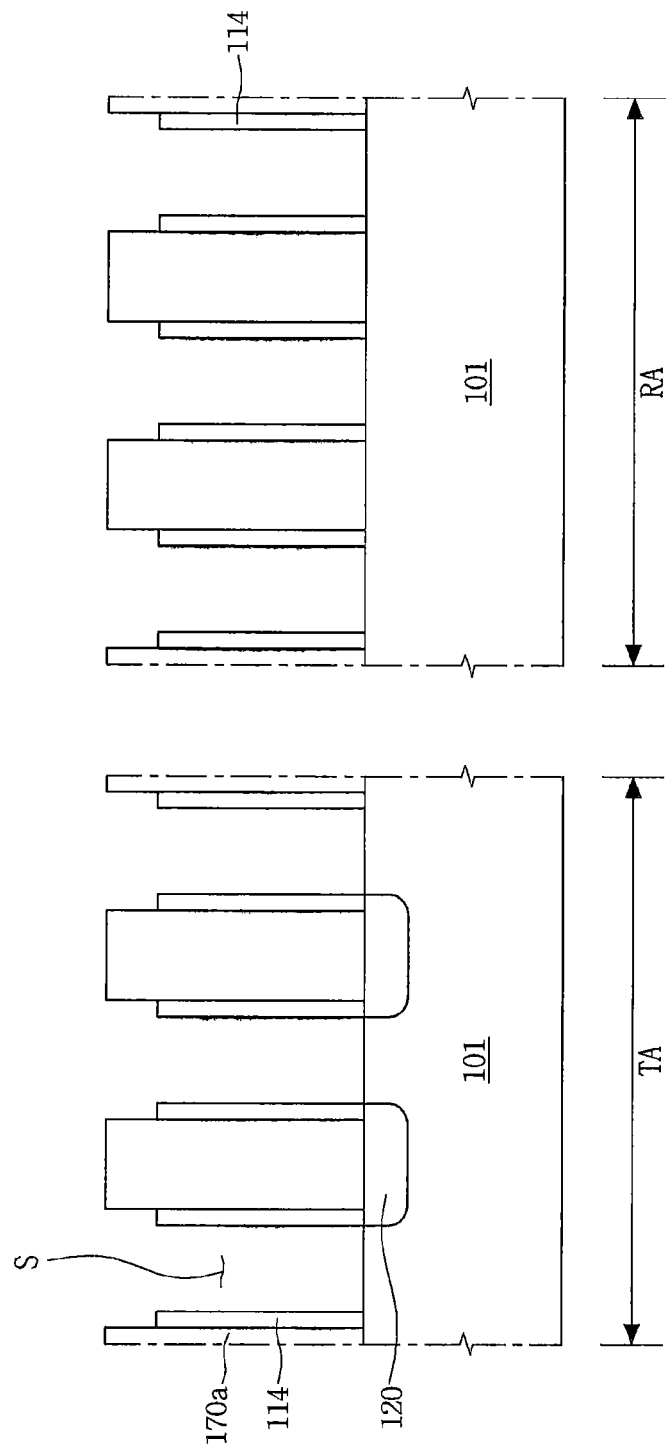

Referring to FIG. 8, the method of fabricating the semiconductor device in accordance with embodiments of the inventive concepts may include removing the exposed hard mask pattern 20 and the sacrificial pattern 10, and forming a space S. The sacrificial pattern 10 may be exposed by first removing the exposed hard mask pattern 20. At this time, the gate spacer pattern 114 may be also removed down to a depth corresponding to a thickness of the hard mask pattern 20. Then, the sacrificial pattern 10 is removed, and the space S may be formed in the gate spacer pattern 114. At this time, the sacrificial buffer insulating pattern 8 may be also removed.

Figure 9:
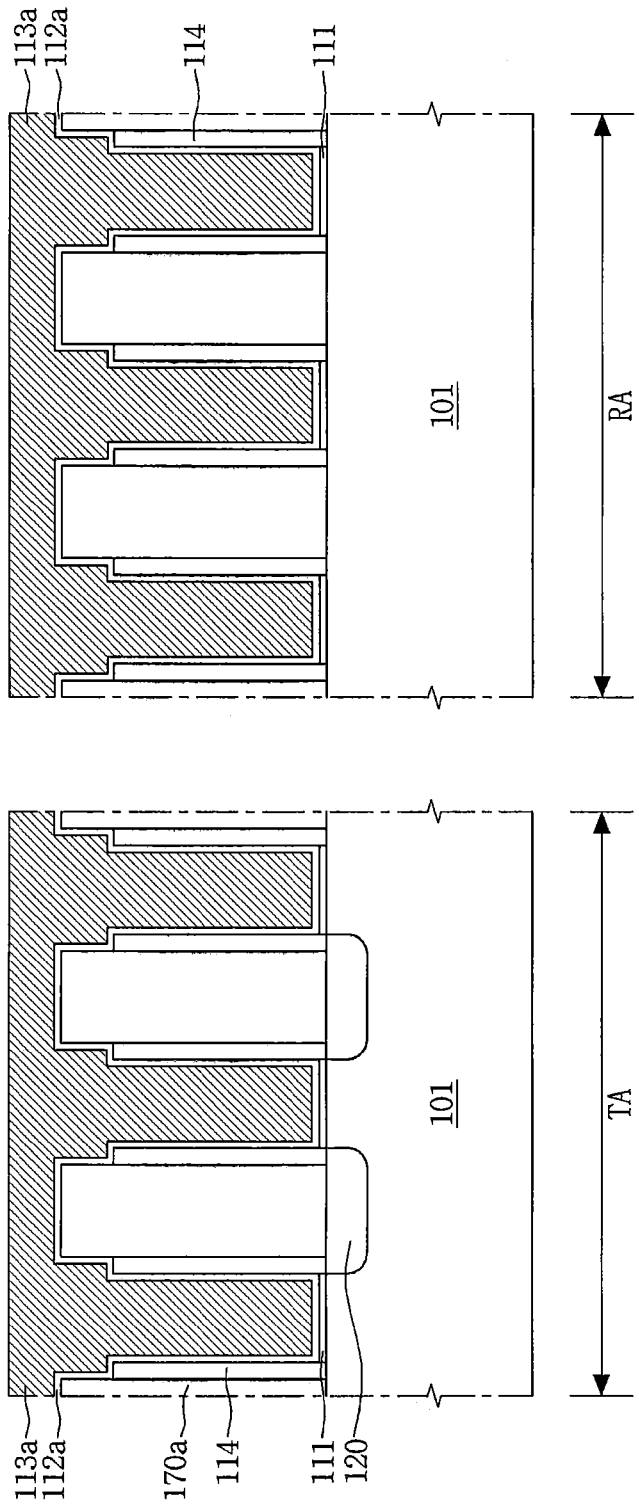

Referring to FIG. 9, the method of fabricating the semiconductor device in accordance with embodiments of the inventive concepts may include forming the gate buffer insulating pattern 111, a gate insulating layer 112a, and a gate electrode layer 113a in the space S. The forming of the gate buffer insulating pattern 111 may include forming a silicon oxide layer by oxidizing the substrate 101. The forming of the gate insulating layer 112a may include conformally forming a metallic oxide, such as hafnium oxide (HfO), which has a higher dielectric constant than silicon oxide, on the upper surface of the gate buffer insulating pattern 111, the side surfaces of the gate spacer pattern 114, the side surfaces of the lower interlayer insulating layer 170a, and the upper surfaces of the lower interlayer insulating layer 170a by performing a deposition process. The gate electrode layer 113a may be formed on the gate insulating layer 112a to fill the space S with tungsten (W) or aluminum (Al) by performing a deposition process.

Figure 10:
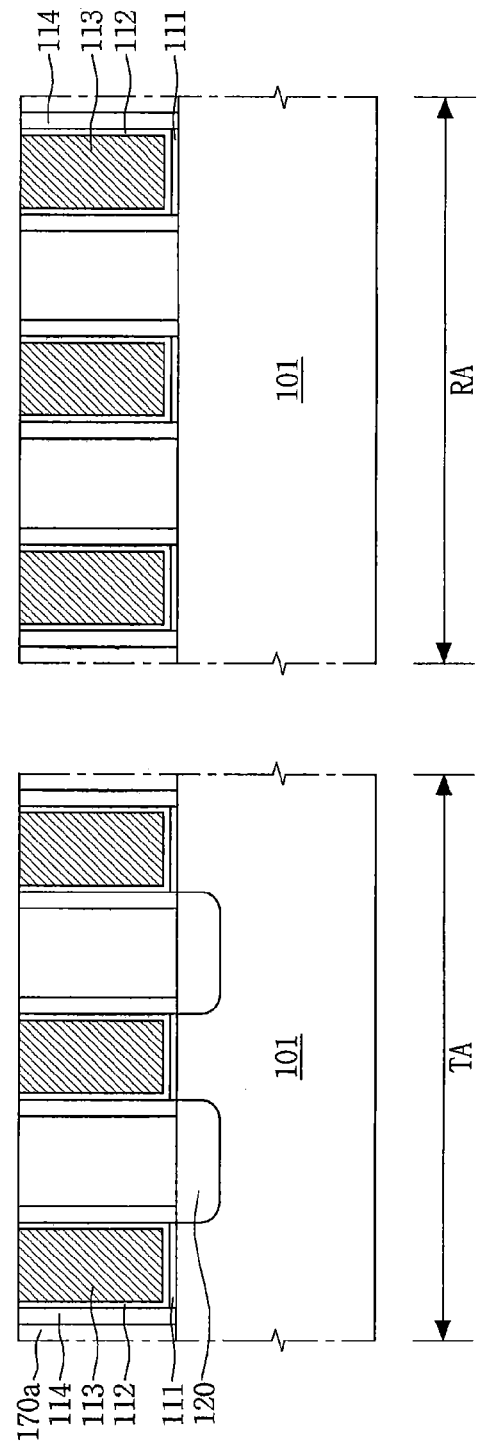
Figure 11:
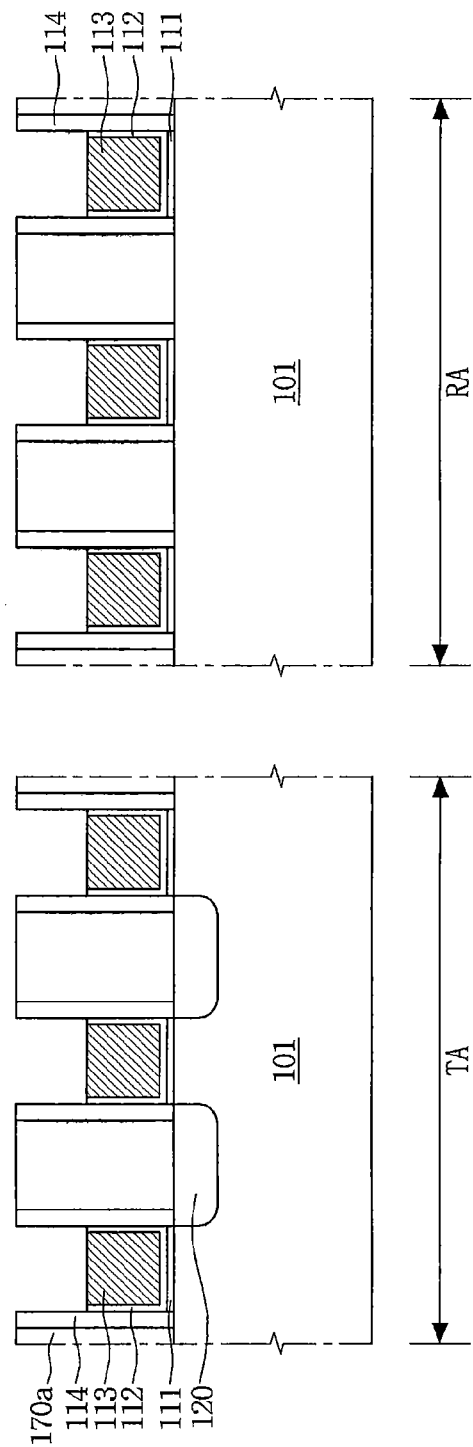

Referring to FIGS. 10 and 11, the method of fabricating the semiconductor device in accordance with embodiments of the inventive concepts may include forming the gate insulating pattern 112 and the gate electrode 113 by performing a planarization process, such as a CMP process, and recessing the formed gate insulating pattern 112 and gate electrode 113. When forming the gate electrode 113, the gate spacer pattern 114 may be also partially removed by the planarization process.

The recessing of the gate insulating pattern 112 and the gate electrode 113 may include removing a part of the gate insulating pattern 112 and a part of the gate electrode 113 by performing an etch-back process. The upper surface of the gate insulating pattern 112 and the upper surface of the gate electrode 113 may be coplanar, and the upper surface of the gate spacer pattern 114 may be higher than the upper surface of the gate insulating pattern 112 and the upper surface of the gate electrode 113 relative to the substrate 101.

Figure 12:
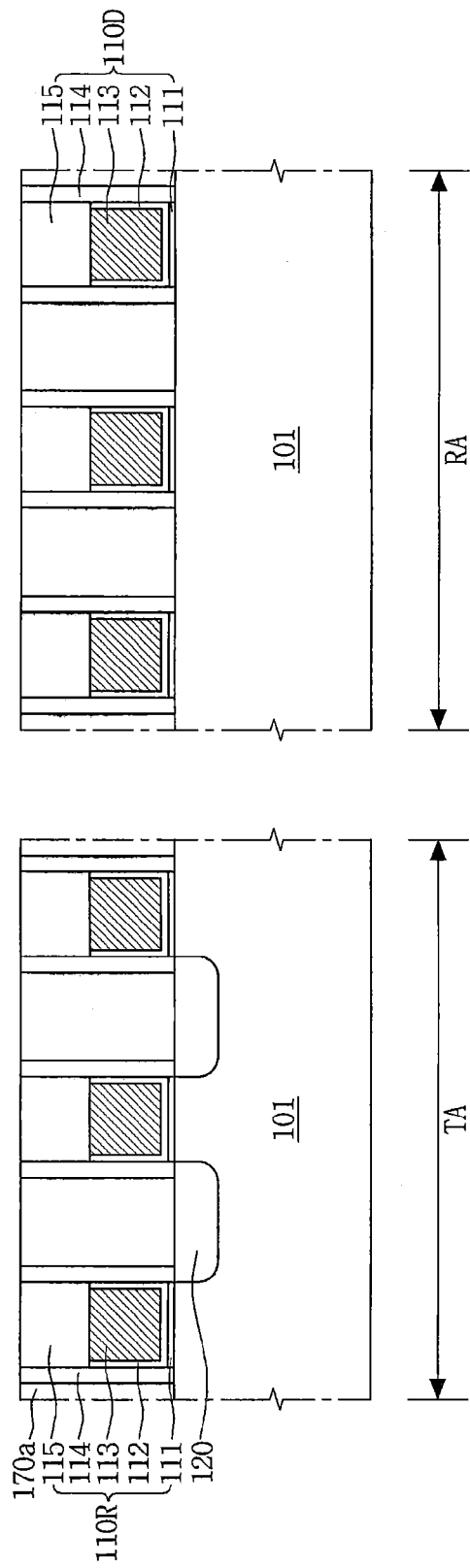

Referring to FIG. 12, the method of fabricating the semiconductor device in accordance with embodiments of the inventive concepts may include forming the gate capping pattern 115 on the gate insulating pattern 112 and the gate electrode 113. The forming of the gate capping pattern 115 may include forming a silicon nitride layer to fill the recessed space formed on upper surfaces of the gate insulating pattern 112 and the gate electrode 113 and to cover the upper surface of the gate spacer pattern 114 and the upper surface of the lower interlayer insulating layer 170a, and exposing the gate spacer pattern 114 and the lower interlayer insulating layer 170a by performing a planarization process, such as a CMP process.

By performing the above described process, gate structures 110 having the gate buffer insulating pattern 111, the gate insulating pattern 112, the gate electrode 113, the gate spacer pattern 114, and the gate capping pattern 115 may be formed. At this time, the gate structures 110 may include the active gate structures 110R formed on the substrate 101 in the transistor area TA, and the dummy gate structures 110D formed on the substrate 101 in the resistor area RA. The active gate structures 110R form transistors together with the source/drain areas 120, and may be used to operate the transistors. The dummy gate structures 110D do not form the transistors and are not used to operate the transistors. According to some embodiments, the dummy gate structures 110D may not be formed on the substrate 101 in the resistor area RA. Therefore, only the lower interlayer insulating layer 170a may be formed.

Figure 13:
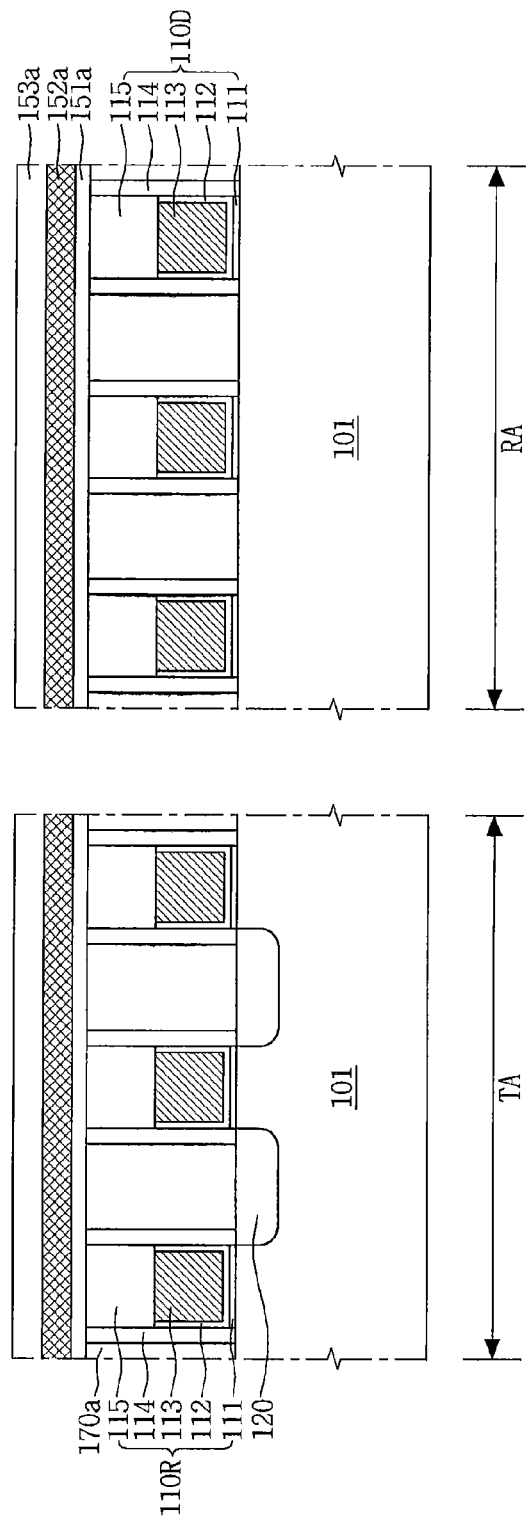

Referring to FIG. 13, the method of fabricating the semiconductor device in accordance with embodiments of the inventive concepts may include sequentially forming a buffer insulating layer 151*a*, a resistor conductive layer 152*a*, and an etch-retard layer 153*a* on the gate structures 110 and the lower interlayer insulating layer 170*a*. The forming of the buffer insulating layer 151*a* may include forming a silicon oxide layer on the gate structures 110 and the lower interlayer insulating layer 170*a* by performing a deposition process. The forming of the resistor conductive layer 152*a* may include forming a metal-silicide layer on the buffer insulating layer 151*a* by performing a deposition process. The metal-silicide layer may include tungsten silicide (WSi). The forming of the etch-retard layer 153*a* may include forming a silicon nitride layer on the resistor conductive layer 152*a* by performing a deposition process. According to some embodiments, the buffer insulating layer 151*a* may not be formed, and the resistor conductive layer 152*a* and the etch-retard layer 153*a* may be sequentially formed on the lower interlayer insulating layer 170*a*.

Figure 14:
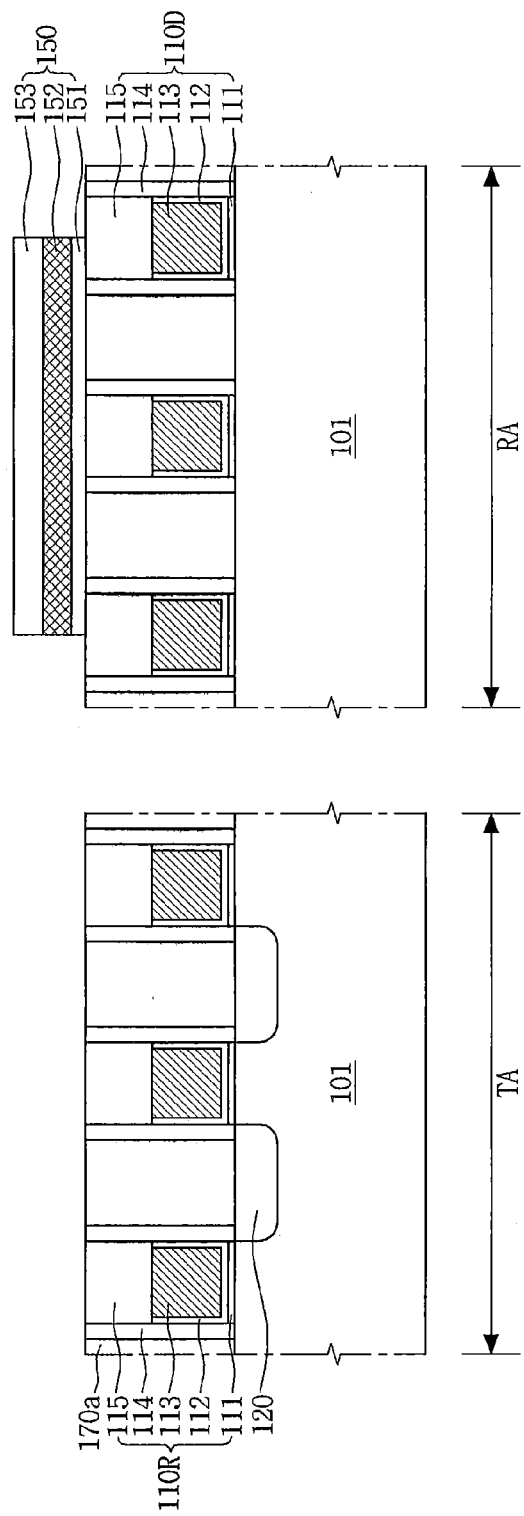

Referring to FIG. 14, the method of fabricating the semiconductor device in accordance with embodiments of the inventive concepts may include selectively removing the buffer insulating layer 151*a*, the resistor conductive layer 152*a*, and the etch-retard layer 153*a*, and forming the resistor structure 150 on the dummy gate structures 100D and the lower interlayer insulating layer 170*a* on the substrate 101 in the resistor area RA. The resistor structure 150 may include the buffer insulating pattern 151, the resistor element 152, and the etch-retard pattern 153. The side surface of the buffer insulating pattern 151, the side surface of the resistor element 152 and the side surface of the etch-retard pattern 153 may be substantially vertically aligned. According to some embodiments, the resistor structure 150 may include only the resistor element 152 and etch-retard pattern 153, as illustrated in FIG. 2B.

Figure 15:
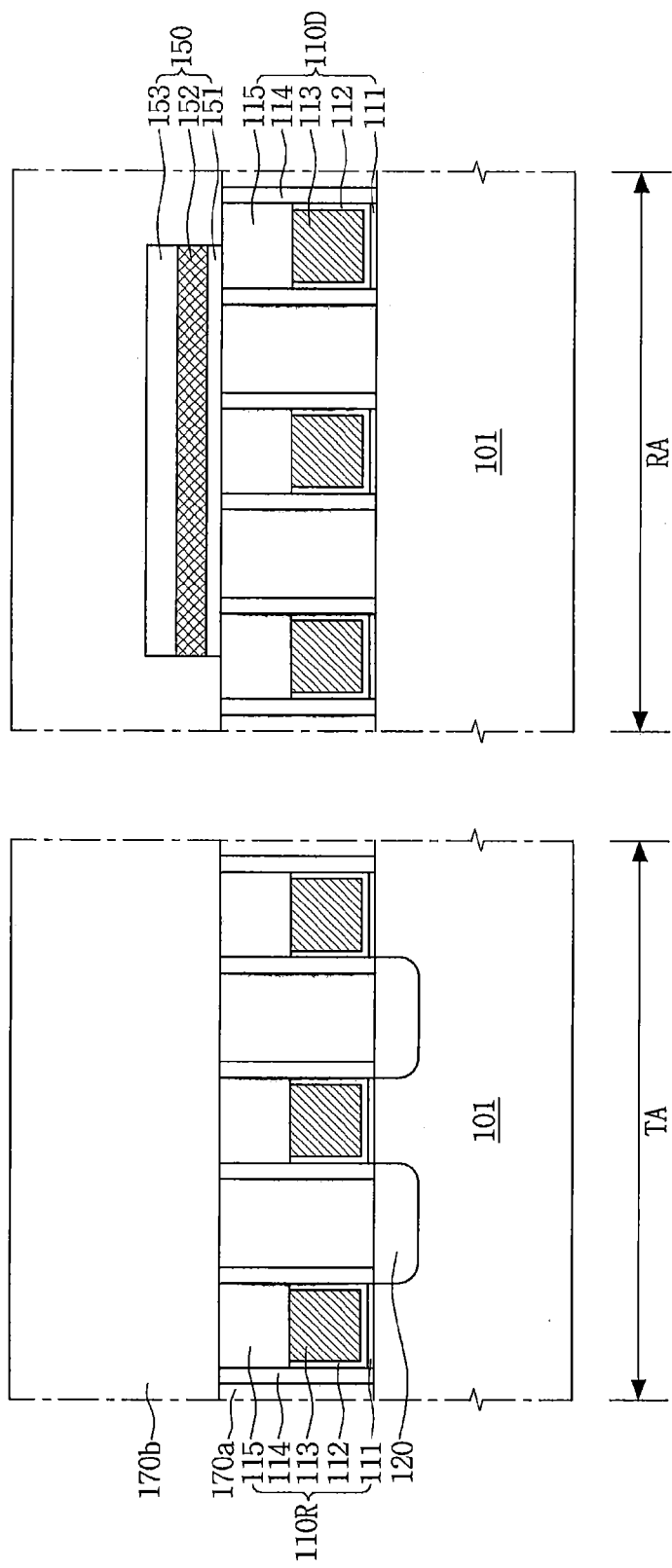

Referring to FIG. 15, the method of fabricating the semiconductor device in accordance with embodiments of the inventive concepts may include forming the intermediate interlayer insulating layer 170*b* to cover the gate structures 110R and 110D, the lower interlayer insulating layer 170*a*, and the resistor structure 150. The forming of the intermediate interlayer insulating layer 170*b* may include forming a silicon oxide layer on the gate structures 110R and 110D, the lower interlayer insulating layer 170*a*, and the resistor structure 150 by performing a deposition process.

Figure 16:
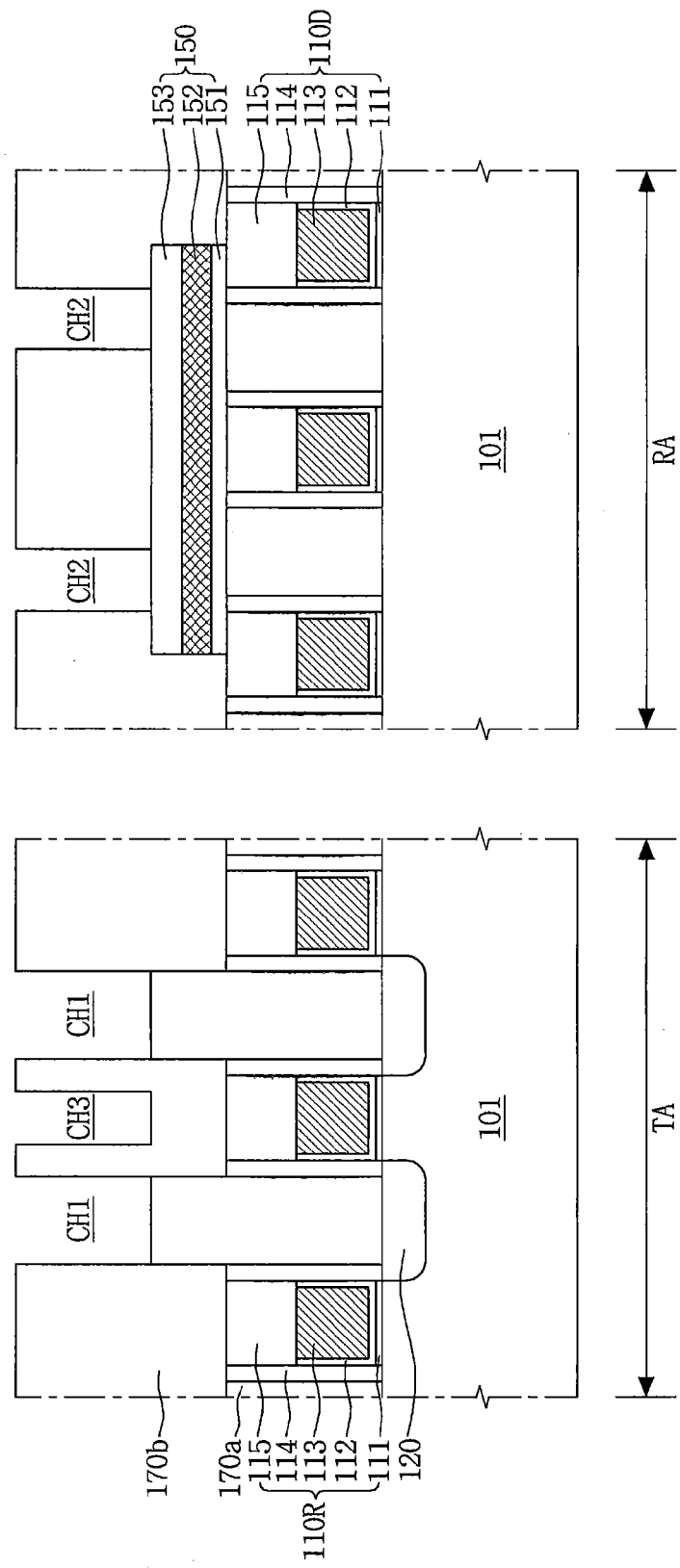
Figure 17:
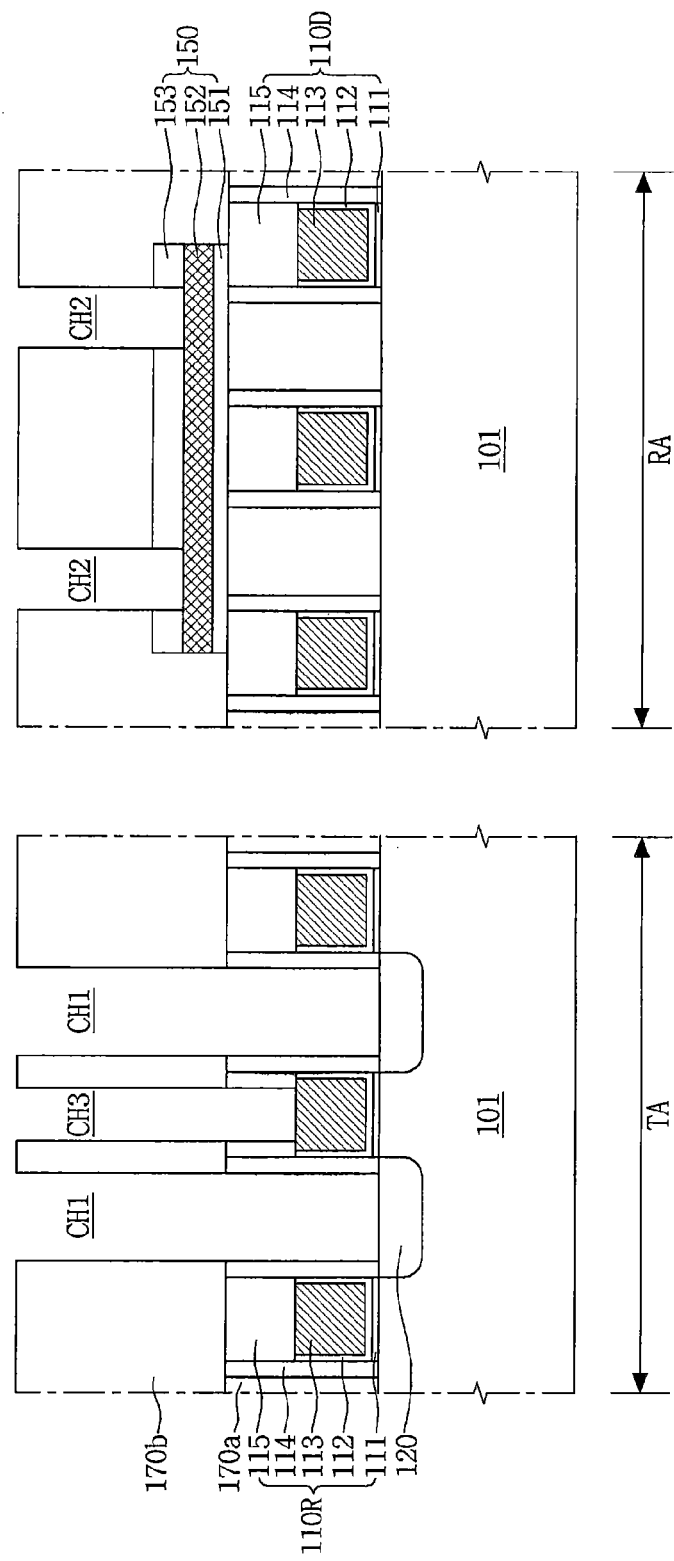

Referring to FIGS. 16 and 17, the method of fabricating the semiconductor device in accordance with embodiments of the inventive concepts may include forming first contact holes CH1 configured to pass through the intermediate interlayer insulating layer 170*b* and to expose the source/drain areas 120, second contact holes CH2 configured to expose the resistor element 152, and third contact holes CH3 configured to expose the gate electrodes 113 of the active gate structures 110R. At this time, the first, second, and third contact holes CH1, CH2, and CH3 may be formed at the same time. According to some embodiments, the first and second contact holes CH1 and CH2 may be first formed, and then the third contact hole CH3 may be formed. Alternatively, the second and third contact holes CH2 and CH3 may be first formed, and then the first contact holes CH1 may be formed.

For example, when the first, second, and third contact holes CH1, CH2, and CH3 are formed at the same time, the first, second, and third contact holes CH1, CH2, and CH3 may be respectively formed at the same rate, until the second contact holes CH2 contact the etch-retard pattern 153 of the resistor structure 150, as illustrated in FIG. 16. Then, when the second contact holes CH2 contact the etch-retard pattern 153 of the resistor structure 150, a forming rate of the second contact holes CH2 may be slower than that of the first and third contact holes CH1 and CH3 due to the etch-retard pattern 153 including silicon nitride having an etching rate that is lower than that of silicon oxide included in the intermediate interlayer insulating layer 170*b* and the lower interlayer insulating layer 170*a*. Therefore, the second contact holes CH2 may not etch the resistor element 152, until the first and third contact holes CH1 and CH3 expose the source/drain areas 120 and the gate electrode 113, respectively. That is, as illustrated in FIG. 17, while the first and third contact holes CH1 and CH3 are formed down to a depth that exposes the source/drain areas 120 and the gate electrode 113, respectively, the second contact holes CH2 may pass through only the etch-retard pattern 153.

Further, when the third contact hole CH3 contacts the gate capping pattern 115 of the active gate structures 110R, the forming rate of the third contact holes CH3 may be slower than that of the first contact holes CH1. Therefore, as illustrated in FIG. 17, each vertical length of the first, second, and third contact holes CH1, CH2, and CH3 may be different. According to some embodiments, when the second contact holes CH2 are formed, the etch-retard pattern 153 may be passed through, and a part of the resistor element 152 may be removed. Therefore, the second contact holes CH2 may extend into the resistor element 152.

Figure 18:
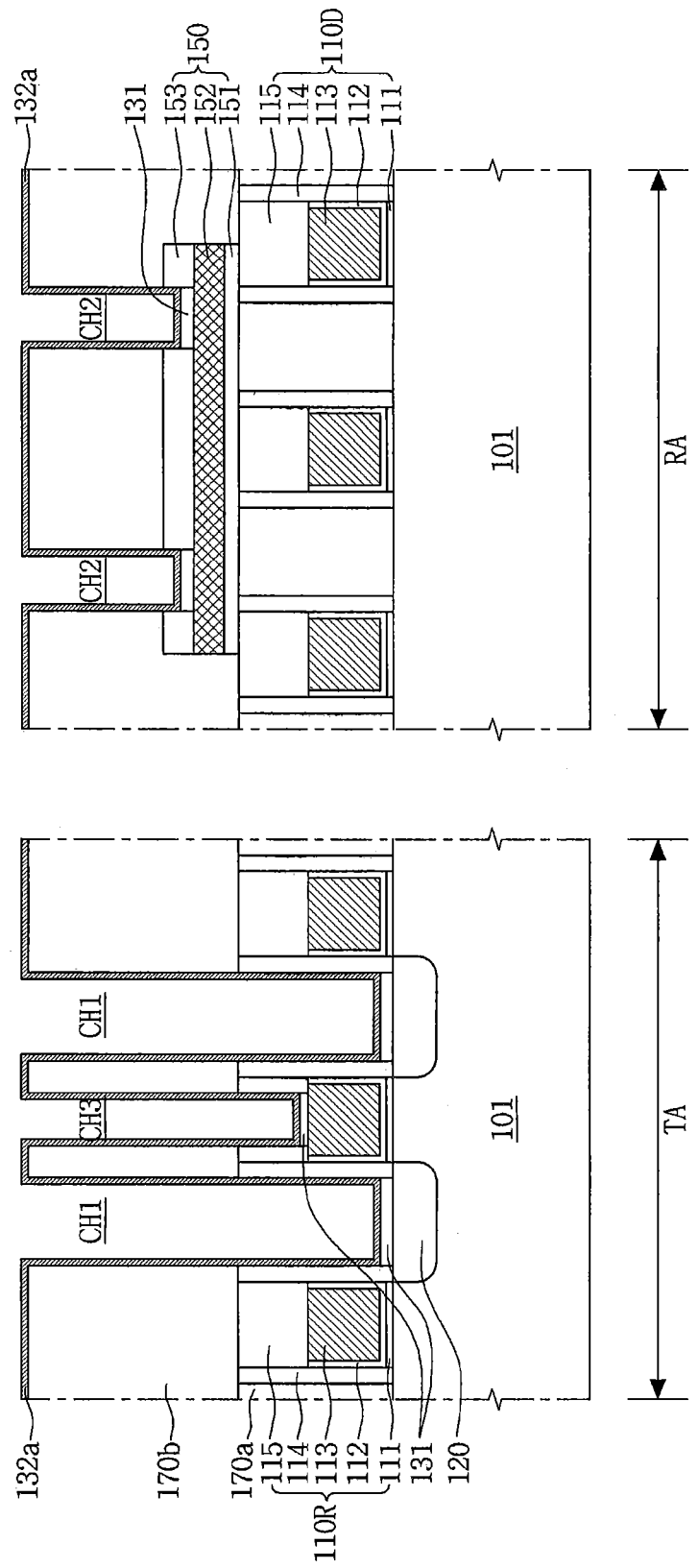

Referring to FIG. 18, the method of fabricating the semiconductor device in accordance with embodiments of the inventive concepts may include sequentially forming the glue pattern 131 and a barrier layer 132*a* in the first, second, and third contact holes CH1, CH2, and CH3. The forming of the glue pattern 131 may include forming a metallic material layer in the first to third contact holes CH1, CH2, and CH3 by performing a physical vapor deposition (PVD) process. The metallic material layer may include titanium (Ti). The forming of the barrier layer 132*a* may include conformally forming a metallic nitride layer on an upper surface of the glue pattern 131, inside walls of the first to third contact holes CH1, CH2, and CH3, and an upper surface of the intermediate interlayer insulating layer 170*b*. The metallic nitride layer may include titanium nitride (TiN).

Figure 19:
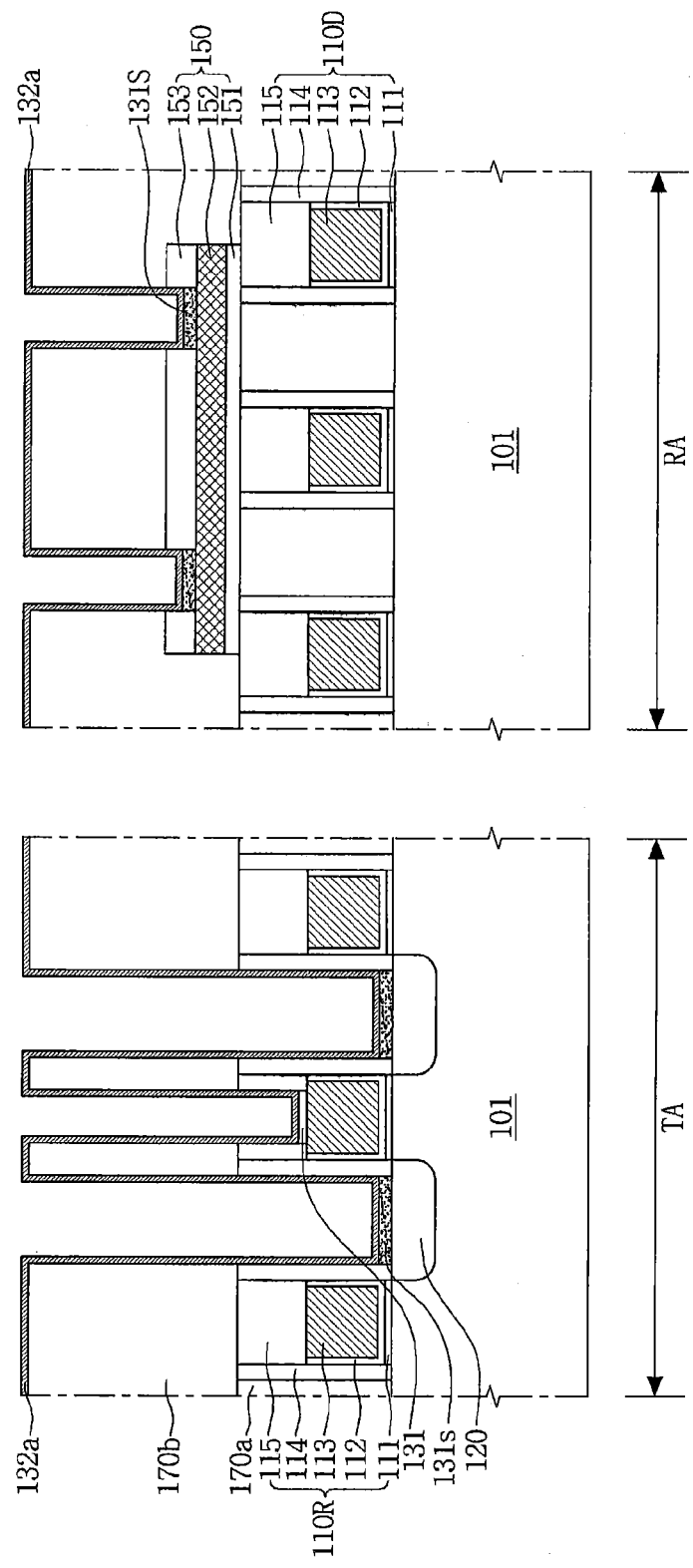

Referring to FIG. 19, the method of fabricating the semiconductor device in accordance with embodiments of the inventive concepts may include forming the silicide pattern 131S on upper surfaces of the source/drain areas 120 and the resistor element 152. The forming of the silicide pattern 131S may include silicidizing the glue pattern 131 by a heat treatment. The silicide pattern 131S may include titanium silicide (TiSi). The silicide pattern 131S including titanium silicide formed on the upper surface of the resistor element 152 may be formed by reacting the glue pattern 131 formed on the upper surface of the resistor element 152 with the resistor element 152 including tungsten silicide.

Figure 20:
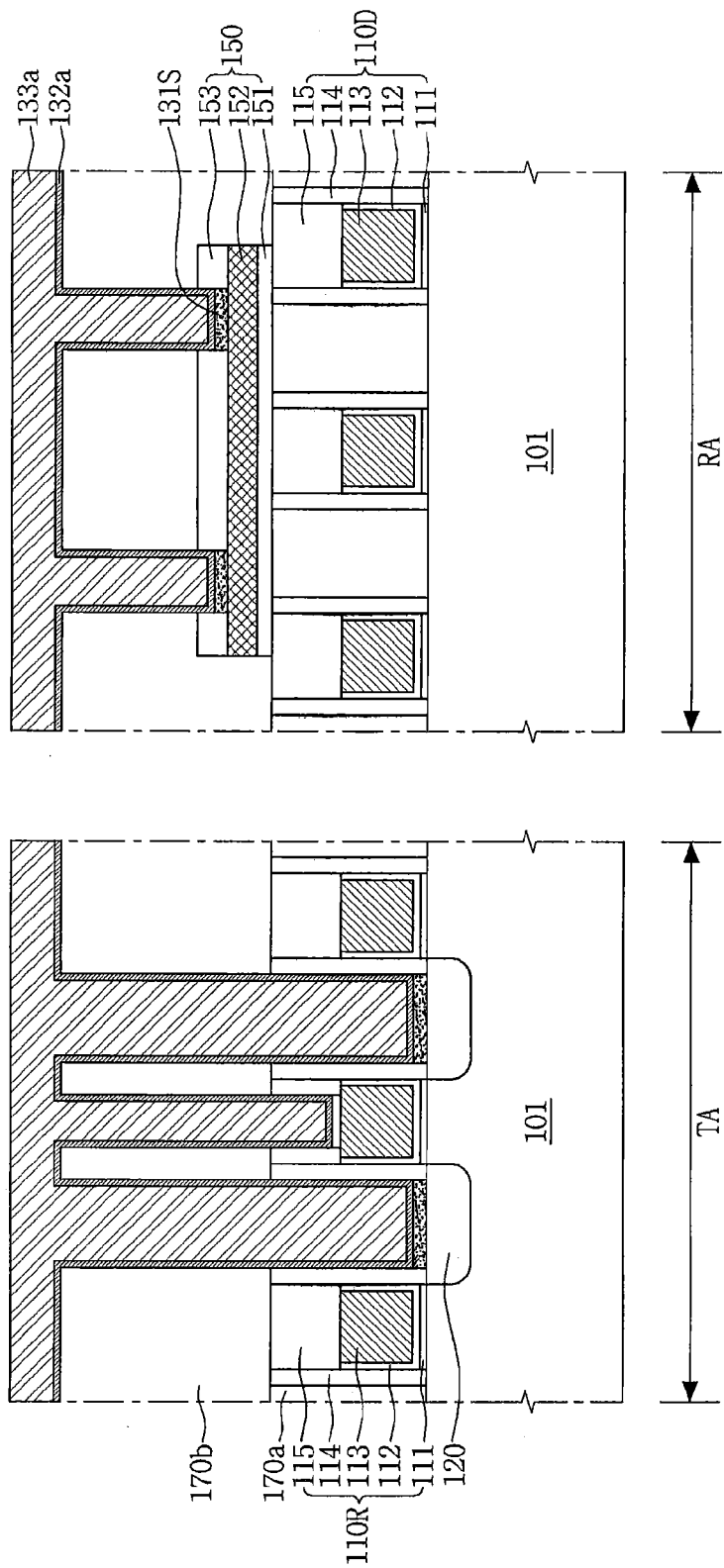

Referring to FIG. 20, the method of fabricating the semiconductor device in accordance with embodiments of the inventive concepts may include forming a core layer 133*a* configured to fill each of the first to third contact holes CH1, CH2, and CH3. The forming of the core layer 133*a* may include forming a metallic material layer configured to fill insides of the first to third contact holes CH1, CH2, and CH3 by performing a deposition process. The metallic material layer may include tungsten (W).

Figure 21:
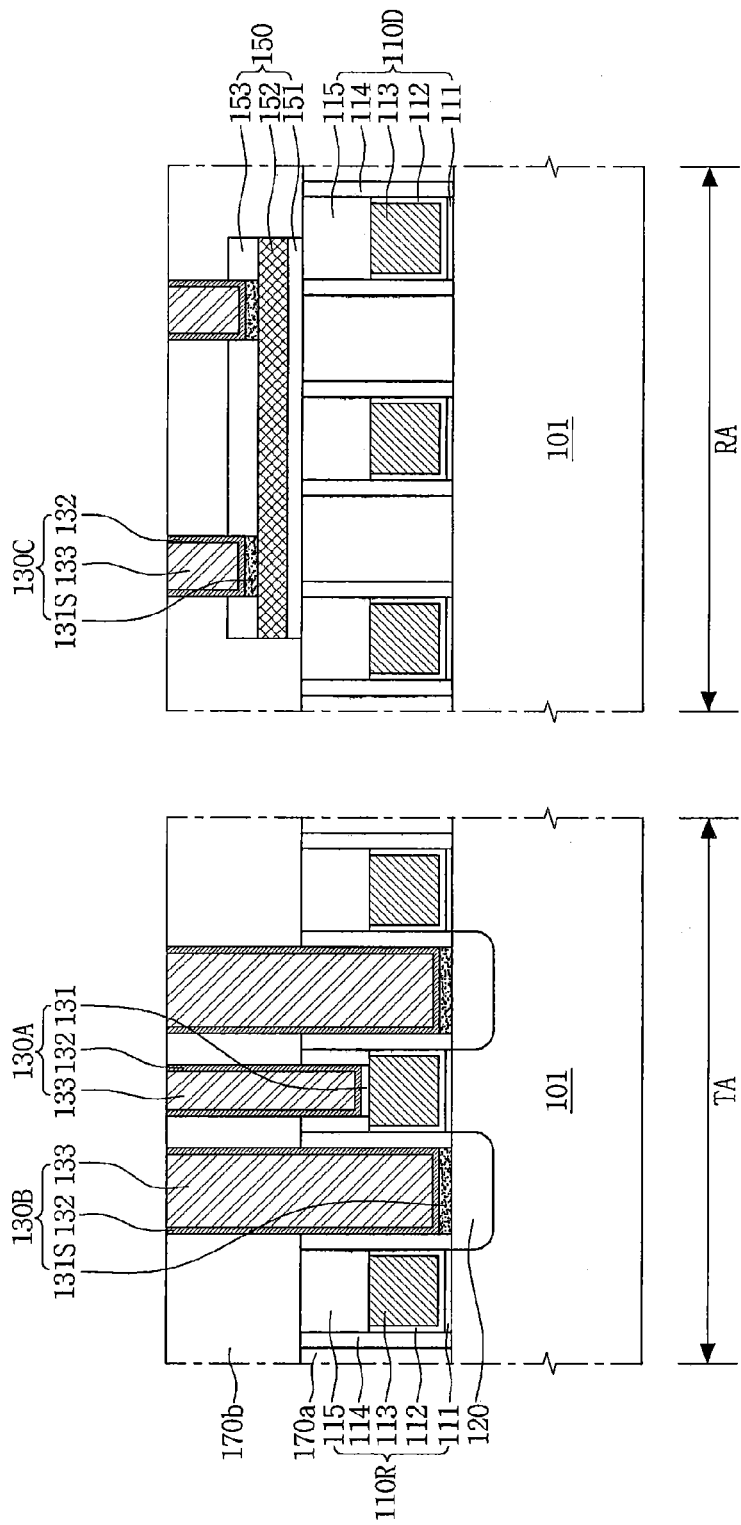

Referring to FIG. 21, the method of fabricating the semiconductor device in accordance with embodiments of the inventive concepts may include forming the gate contact structures 130A in contact with the active gate structures 110R, the source/drain contact structures 130B in contact with the source/drain areas 120, and the resistor contact structures 130C in contact with the resistor element 152 of the resistor structure 150 by performing a planarization process, such as a CMP process. According to some embodiments, as illustrated in FIGS. 2C and 2D, the lower ends of the resistor contact structures 130C may extend into the resistor element 152. Therefore, the lower ends of the resistor contact structures 130C may be disposed in the resistor element 152.

Referring to FIG. 2A to 2D, the method of fabricating the semiconductor device in accordance with embodiments of the inventive concepts may include forming the upper interlayer insulating layer 170c configured to cover the gate contact structures 130A, the source/drain contact structures 130B, the resistor contact structures 130C, and the intermediate interlayer insulating layer 170b. The forming of the upper interlayer insulating layer 170c may include forming a silicon oxide layer on the gate contact structures 130A, the source/drain contact structures 130B, the resistor contact structures 130C, and the intermediate interlayer insulating layer 170b by performing a deposition process.

Figure 22:
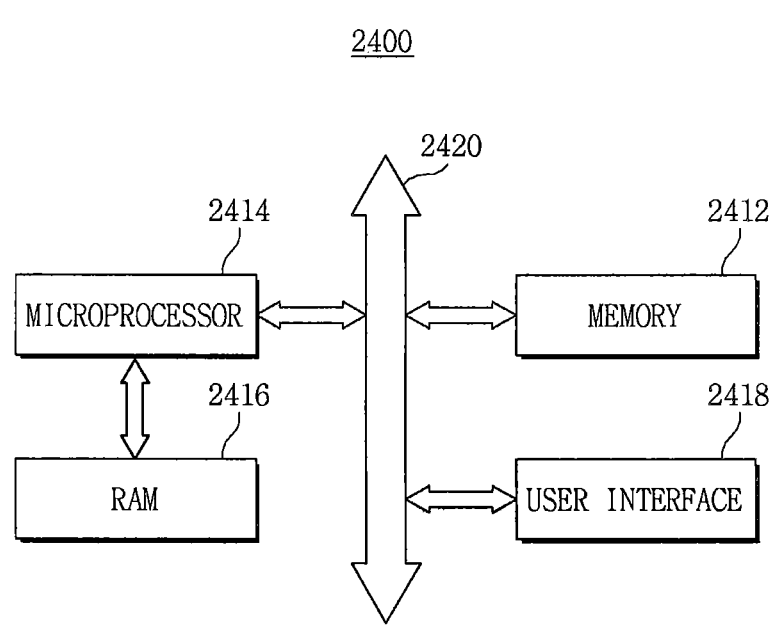
FIG. 22 is a conceptual block diagram of an electronic system including at least one of the semiconductor devices of FIGS. 1-21 in accordance with various embodiments of the inventive concepts.

FIG. 22 is a block diagram schematically illustrating an electronic system 2400 including at least one of the semiconductor devices in accordance with embodiments of the inventive concepts. Referring to FIG. 22, the electronic system 2400 may include at least one of the semiconductor devices described above in accordance with various embodiments of the inventive concepts. The electronic system 2400 may be used to manufacture a mobile device or a computer. For example, the electronic system 2400 may include a microprocessor 2414, a RAM 2416, and a user interface 2418, which perform data communication through a bus 2420 with a memory system 2412. The microprocessor 2414 may program and control the electronic system 2400. For example, the microprocessor 2414 or the RAM 2416 may include one or more semiconductor devices in accordance with the embodiments of the inventive concept. The microprocessor 2414, the RAM 2416, and/or the other components may be assembled in a single package. The user interface 2418 may be used to input data into the electronic system 2400 or to output data from the electronic system 2400. The memory system 2412 may store operation codes of the microprocessor 2414, data processed by the microprocessor 2414, or data input from the outside. The memory system 2412 may include a controller and a memory device.

In a semiconductor device in accordance with embodiments of the inventive concepts, because the etch-stop pattern is formed on the resistor element, the contact hole may not pass through the resistor element when the contact hole is formed.

Further, in the semiconductor device in accordance with the embodiments of the inventive concepts, because the dummy gate structures are formed on the resistor area of the substrate, the interlayer insulating layer may not be excessively polished in a planarization process after forming the interlayer insulating layer.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concepts as defined in the claims.

What is claimed is:

1. A method of fabricating a semiconductor device, comprising:
    providing a substrate including a transistor area and a resistor area;
    forming active gate structures on the substrate in the transistor area;
    forming dummy gate structures on the substrate in the resistor area;
    forming a lower interlayer insulating layer on the substrate to cover side walls of the active gate structures and the dummy gate structures;
    forming a resistor structure comprising a buffer insulating pattern, a resistor element, and an etch-retard pattern stacked sequentially on the dummy gate structures and the lower interlayer insulating layer in the resistor area;
    forming an intermediate interlayer insulating layer on the lower interlayer insulating layer to cover the resistor structure;
    forming resistor contact structures configured to pass through the intermediate interlayer insulating layer and the etch-retard pattern, and to contact the resistor element; and
    forming an upper interlayer insulating layer on the intermediate interlayer insulating layer and the resistor contact structures.

2. The method according to claim 1, further comprising forming source/drain areas in the substrate between the active gate structures,
    wherein the source/drain areas are covered by the lower interlayer insulating layer.

3. The method according to claim 2, further comprising forming gate contact structures configured to pass through the intermediate interlayer insulating layer in the transistor area, and source/drain contact structures configured to pass through the intermediate interlayer insulating layer and the lower interlayer insulating layer, and
    forming the upper interlayer insulating layer on the intermediate interlayer insulating layer to cover the source/drain contact structures and the gate contact structures,
    wherein the source/drain contact structures are in contact with the source/drain areas, and the gate contact structures are in contact with the active gate structures.

4. The method according to claim 3, wherein the forming of each of the gate contact structures comprises:
    forming a core pattern including tungsten;
    forming a barrier pattern including a metallic nitride which covers a lower surface and side surfaces of the core pattern; and
    forming a glue pattern including a metallic material disposed under the barrier pattern and in contact with each of the active gate structures.

5. The method according to claim 3, wherein the forming of each of the source/drain contact structures comprises:
    forming a core pattern including tungsten;
    forming a barrier pattern including a metallic nitride which covers a lower surface and side surfaces of the core pattern; and
    forming a silicide pattern disposed under the barrier pattern and in contact with each of the source/drain areas.

6. The method according to claim 1, wherein a side surface of the buffer insulating pattern, a side surface of the resistor element, and a side surface of the etch-retard pattern are substantially vertically aligned.

7. The method according to claim 1, wherein the resistor contact structures extend into the resistor element.

8. The method according to claim 1, wherein the forming of each of the resistor contact structures comprises:
    forming a core pattern including tungsten;
    forming a barrier pattern including a metallic nitride which covers a lower surface and side surfaces of the core pattern; and forming a silicide pattern disposed under the barrier pattern and in contact with the resistor element.

9. The method according to claim 1, wherein the resistor element includes tungsten silicide.

10. The method according to claim 1, wherein the etch-retard pattern includes silicon nitride.

11. A method of fabricating a semiconductor device, comprising:
providing a substrate including a transistor area and a resistor area;
forming active gate structures on the substrate in the transistor area, and dummy gate structures on the substrate in the resistor area;
forming source/drain areas in the substrate between the active gate structures;
forming a lower interlayer insulating layer on the substrate between the active gate structures and between the dummy gate structures to cover the source/drain areas;
sequentially forming a buffer insulating layer, a resistor conductive layer, and an etch-retard layer on the active gate structures, the dummy gate structures, and the lower interlayer insulating layer;
patterning the buffer insulating layer, the resistor conductive layer, and the etch-retard layer, and forming a resistor structure including a buffer insulating pattern, a resistor element, and an etch-retard pattern in the resistor area, wherein a side surface of the buffer insulating pattern, a side surface of the resistor element, and a side surface of the etch-retard pattern are substantially and vertically arranged;
forming an intermediate interlayer insulating layer configured to cover the active gate structures, the dummy gate structures, the lower interlayer insulating layer, and the resistor structures;
forming first contact holes configured to expose the source/drain areas in the intermediate interlayer insulating layer and the lower interlayer insulating layer, second contact holes configured to expose the resistor element in the intermediate interlayer insulating layer and the etch-retard pattern, and third contact holes configured to expose the active gate structures in the intermediate interlayer insulating layer;
forming source/drain contact structures in the first contact holes, resistor contact structures in the second contact holes, and gate contact structures in the third contact holes; and
forming an upper interlayer insulating layer on the intermediate interlayer insulating layer to cover the source/drain contact structures, the resistor contact structures, and the gate contact structures.

12. The method according to claim 11, wherein the first contact holes, the second contact holes, and the third contact holes are formed at a same time.

13. The method according to claim 11, wherein the forming of the source/drain contact structures, the resistor contact structures, and the gate contact structures comprises:

forming a silicide pattern in each of the first contact holes and the second contact holes, and forming a conductive pattern in the third contact holes;
forming a barrier layer on inside walls of the first to third contact holes;
forming a metallic material layer on the barrier layer to fill the first to third contact holes; and
planarizing the barrier layer and the metallic material layer, and forming a barrier pattern and a metallic pattern in each of the first to third contact holes.

14. The method according to claim 13, wherein the forming of the silicide pattern comprises:
forming the conductive pattern in the first contact holes and the second contact holes; and
silicidizing the conductive pattern by a heat treatment.

15. The method according to claim 11, wherein the lower interlayer insulating layer includes silicon oxide, and the buffer insulating pattern includes silicon oxide which is denser than the lower interlayer insulating layer.

16. A method, comprising:
providing a substrate comprising a transistor area and a resistor area;
forming gate structures on the resistor area of the substrate;
forming a resistor element of on the gate structures;
forming an etch-retard pattern on the resistor element, the etch-retard pattern having openings formed therein to expose the resistor element; and
forming resistor contact structures comprising a silicide pattern on the resistor element in the openings formed in the etch-retard pattern,
wherein a side surface of the resistor element and a side surface of the etch-retard pattern are substantially vertically aligned; and
wherein forming the resistor contact structures comprises:
forming a barrier pattern on the silicide pattern; and
forming a core pattern on the barrier pattern.

17. The method of claim 16, further comprising:
forming a buffer insulating pattern on the gate structures;
wherein forming the resistor element comprises forming the resistor element on the buffer insulating pattern.

18. The method of claim 16, further comprising:
forming an interlayer insulating layer on the gate structures to cover the resistor element;
wherein the interlayer insulating layer has openings formed therein corresponding to the openings formed in the etch-retard pattern such that the resistor contact structures extend through the interlayer insulating layer and the etch-retard pattern to contact the resistor element.

19. The method of claim 16, further comprising:
wherein the resistor element comprises tungsten silicide, the etch-retard pattern comprises silicon nitride, and the silicide pattern comprises titanium silicide.

* * * * *